(12) United States Patent
Nagahama

(10) Patent No.: US 11,127,773 B2
(45) Date of Patent: Sep. 21, 2021

(54) SEMICONDUCTOR DEVICE, METHOD OF MANUFACTURING SEMICONDUCTOR DEVICE, AND ELECTRONIC APPARATUS

(71) Applicant: SONY SEMICONDUCTOR SOLUTIONS CORPORATION, Kanagawa (JP)

(72) Inventor: Yoshihiko Nagahama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/497,466

(22) PCT Filed: Feb. 15, 2018

(86) PCT No.: PCT/JP2018/005279
§ 371 (c)(1),
(2) Date: Sep. 25, 2019

(87) PCT Pub. No.: WO2018/186026
PCT Pub. Date: Oct. 11, 2018

(65) Prior Publication Data
US 2020/0035736 A1 Jan. 30, 2020

(30) Foreign Application Priority Data

Apr. 4, 2017 (JP) .............................. JP2017-074801
Apr. 14, 2017 (JP) .............................. JP2017/080689

(51) Int. Cl.
*H01L 21/30* (2006.01)
*H01L 23/52* (2006.01)
(Continued)

(52) U.S. Cl.
CPC .. *H01L 27/14634* (2013.01); *H01L 21/76843* (2013.01); *H01L 21/76898* (2013.01);
(Continued)

(58) Field of Classification Search
CPC ............. H01L 23/481; H01L 27/14636; H01L 2224/08147
(Continued)

(56) References Cited

U.S. PATENT DOCUMENTS 9,853,541 B2* 12/2017 Hwang ................. H01L 23/481
2013/0009305 A1* 1/2013 Oshida ..................... H01L 24/03
257/737
(Continued)

FOREIGN PATENT DOCUMENTS

CN 105280657 A 1/2016
CN 105575890 A 5/2016
(Continued)

OTHER PUBLICATIONS

International Search Report and Written Opinion of PCT Application No. PCT/JP2018/005279, dated Mar. 27, 2018, 09 pages of ISRWO.

*Primary Examiner* — Calvin Lee
(74) *Attorney, Agent, or Firm* — Chip Law Group

(57) ABSTRACT

Provided is a semiconductor device including a plurality of substrates that is stacked, each of the substrates including a semiconductor substrate and a multi-layered wiring layer on the semiconductor substrate, the semiconductor substrate having a circuit with a predetermined function formed thereon. Bonding surfaces between at least two substrates among the plurality of substrates have an electrode junction structure in which electrodes on the respective bonding surfaces are in direct contact with each other. The electrode junction structure is for electrical connection between the two substrates. In at least one of the two substrates, at least one of the electrode constituting the electrode junction structure or a via for connection of the electrode to a wiring line in the multi-layered wiring layer has a structure in which a protective film for prevention of diffusion of an electri- (Continued)

cally-conductive material constituting the electrode and the via is inside the electrically-conductive material.

19 Claims, 22 Drawing Sheets

(51) Int. Cl.
*H01L 27/146* (2006.01)
*H01L 21/768* (2006.01)
*H01L 23/532* (2006.01)
*H01L 23/00* (2006.01)

(52) U.S. Cl.
CPC ........ *H01L 23/53238* (2013.01); *H01L 24/08* (2013.01); *H01L 24/80* (2013.01); *H01L 27/14636* (2013.01); *H01L 2224/08146* (2013.01); *H01L 2224/80895* (2013.01)

(58) Field of Classification Search
USPC .................. 257/758, 774; 438/455, 652, 675
See application file for complete search history.

(56) References Cited

U.S. PATENT DOCUMENTS

| | | | |
|---|---|---|---|
| 2013/0105663 | A1 | 5/2013 | Endo et al. |
| 2016/0013099 | A1 | 1/2016 | Tanida et al. |
| 2016/0126136 | A1 | 5/2016 | Ashidate et al. |
| 2016/0254299 | A1* | 9/2016 | Gomi ................ H01L 27/14634 257/447 |
| 2020/0020733 | A1* | 1/2020 | Fujii ..................... H01L 23/481 |
| 2020/0098815 | A1* | 3/2020 | Kameshima ........ H01L 27/1469 |

FOREIGN PATENT DOCUMENTS

| | | |
|---|---|---|
| JP | 2012-019148 A | 1/2012 |
| JP | 2014-099582 A | 5/2014 |
| JP | 2016-018879 A | 2/2016 |
| JP | 2016-092197 A | 5/2016 |
| JP | 2017-055049 A | 3/2017 |
| KR | 10-2016-0006102 A | 1/2016 |
| KR | 10-2016-0052330 A | 5/2016 |
| TW | 201612964 A | 4/2016 |
| TW | 201626535 A | 7/2016 |
| WO | 2012/004964 A1 | 1/2012 |

* cited by examiner

[FIG. 1]
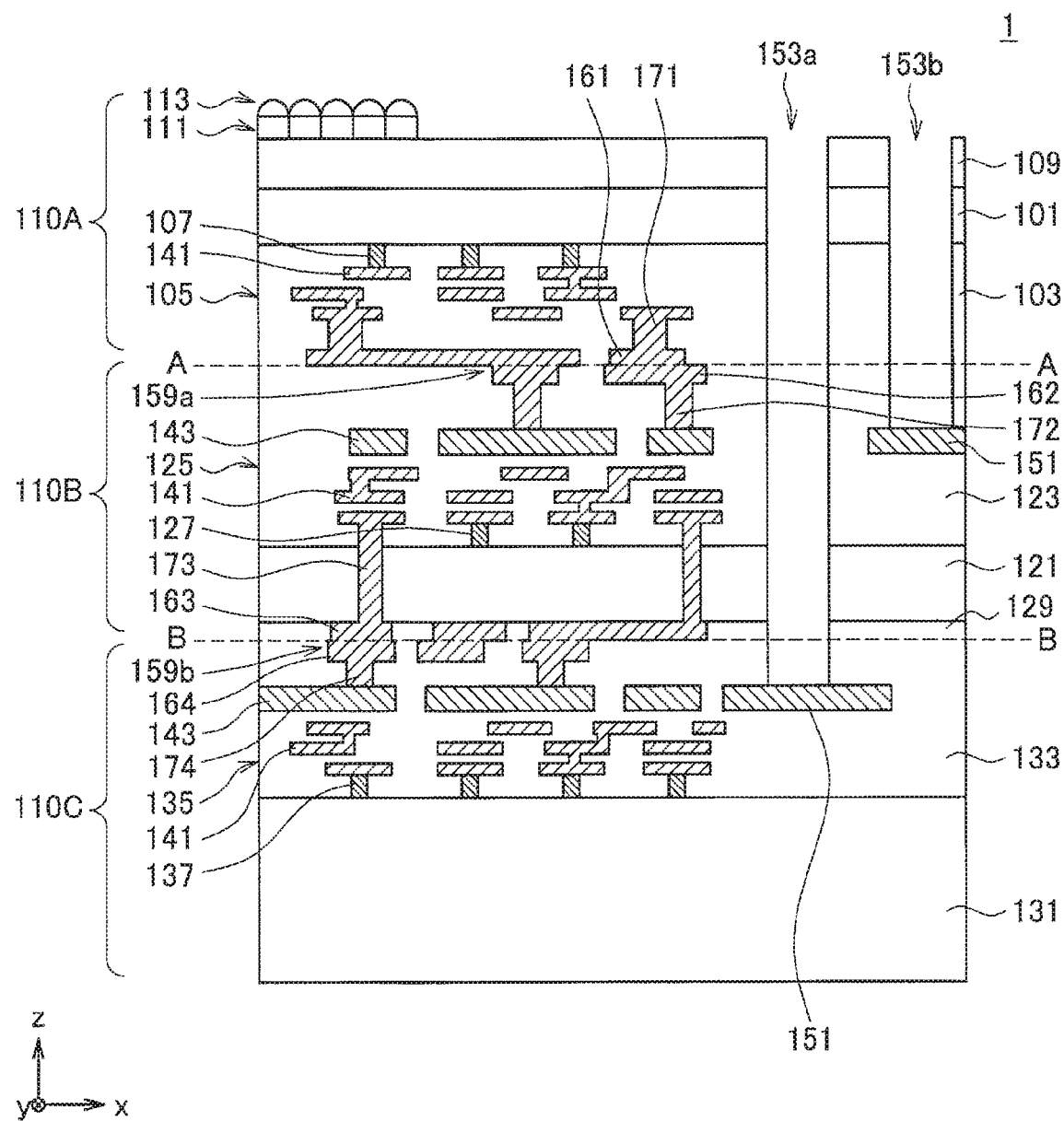

[FIG. 2A]
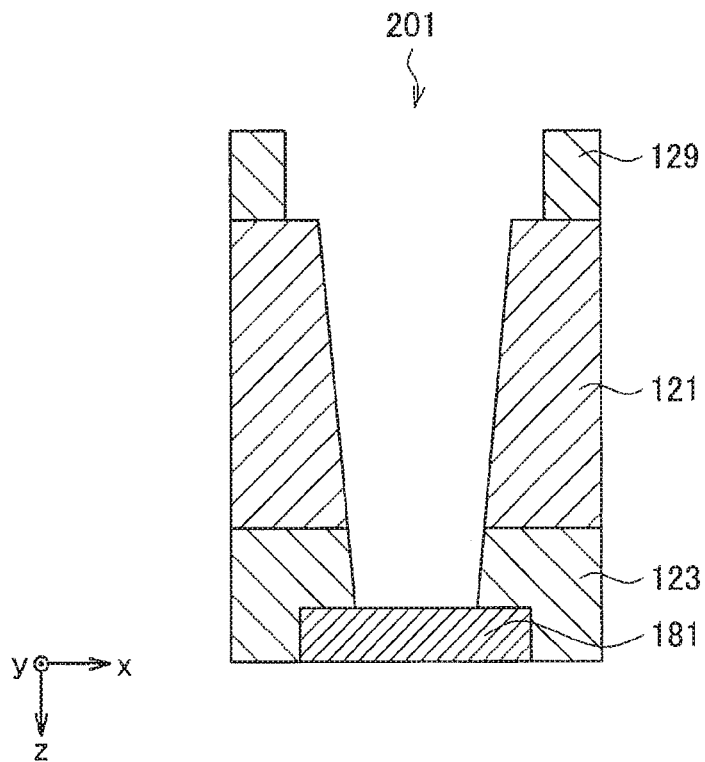
[FIG. 2B]
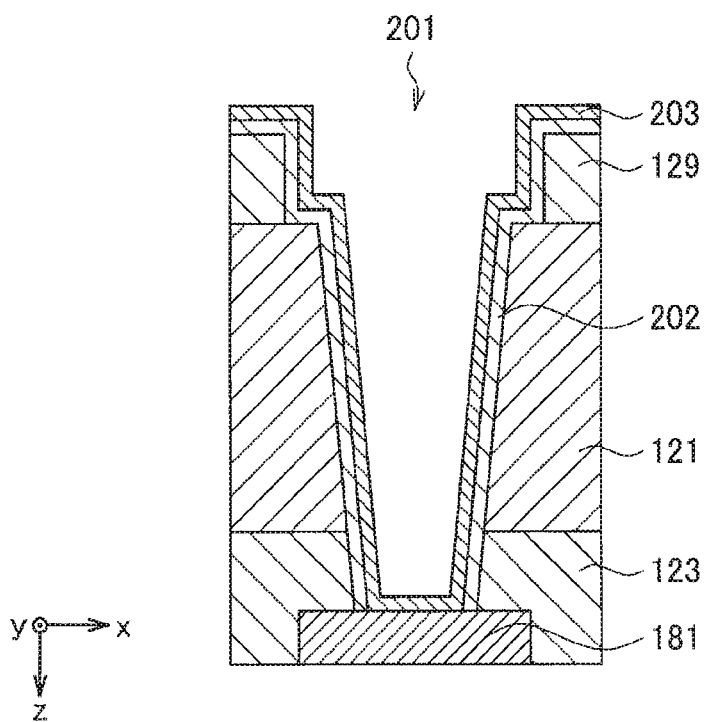

[FIG. 2C]
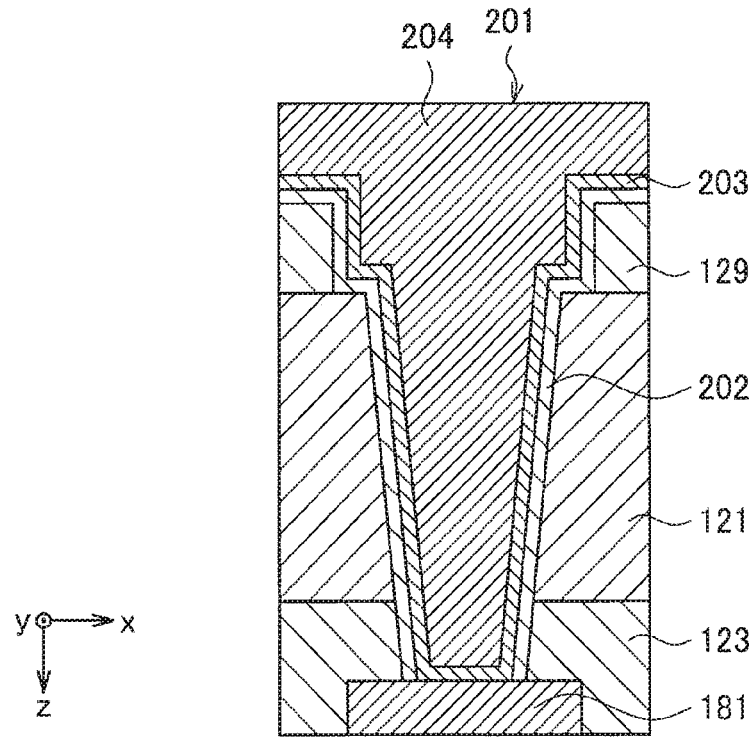
[FIG. 2D]
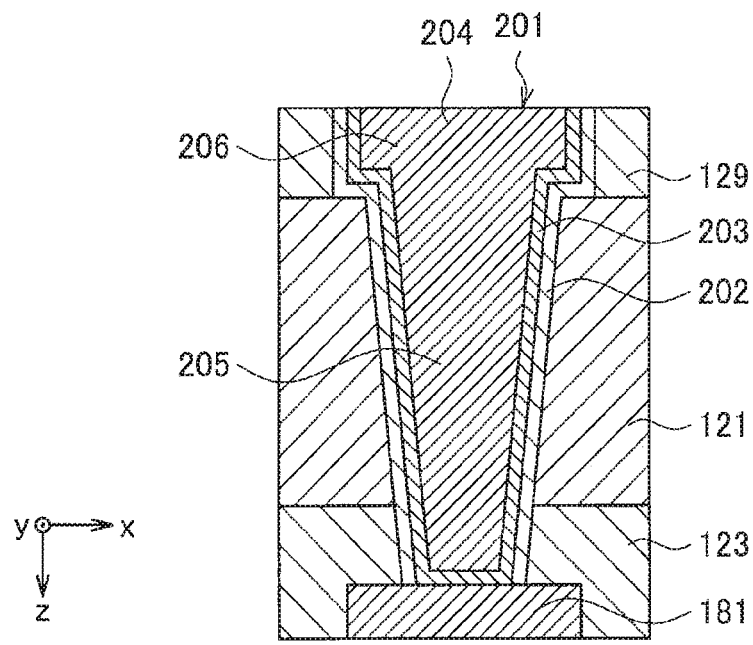

[FIG. 3]
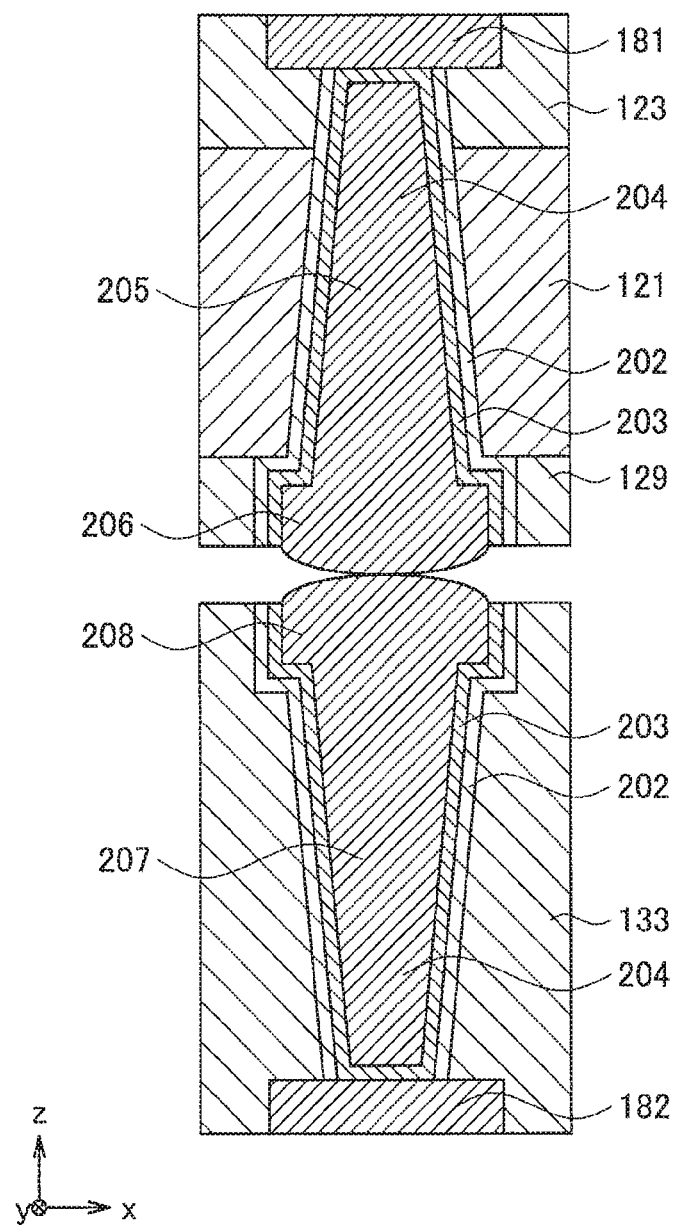

[FIG. 4A]
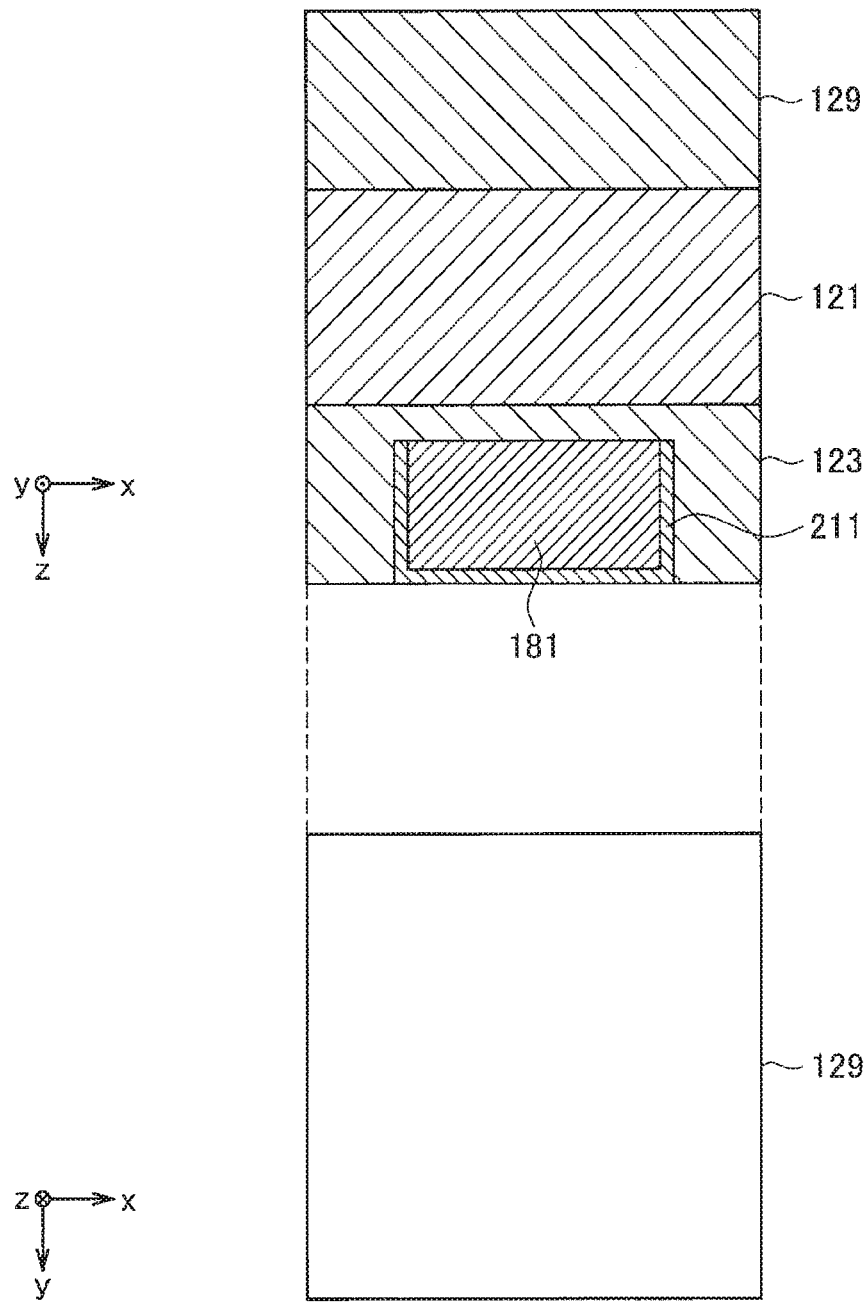

[FIG. 4B]
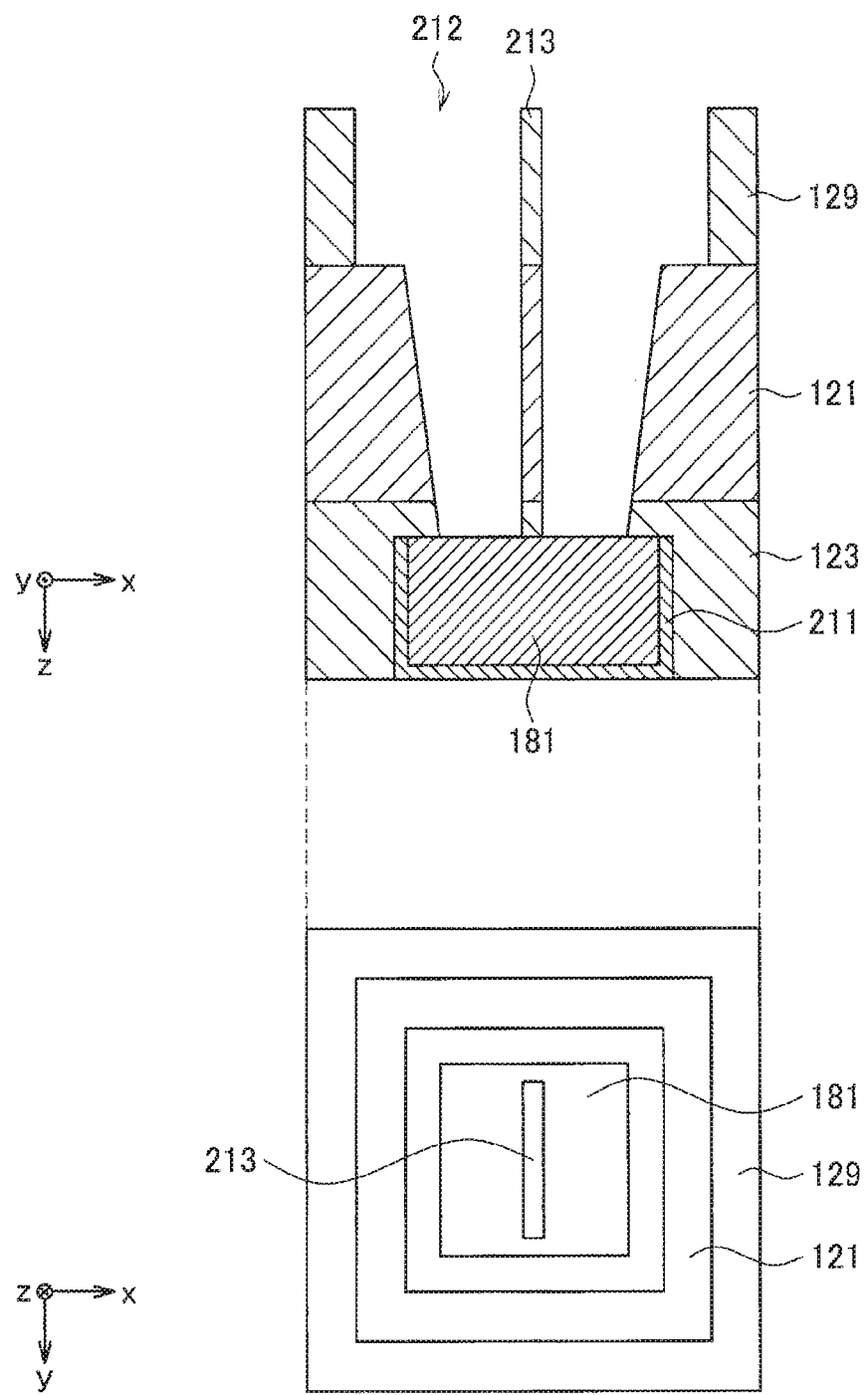

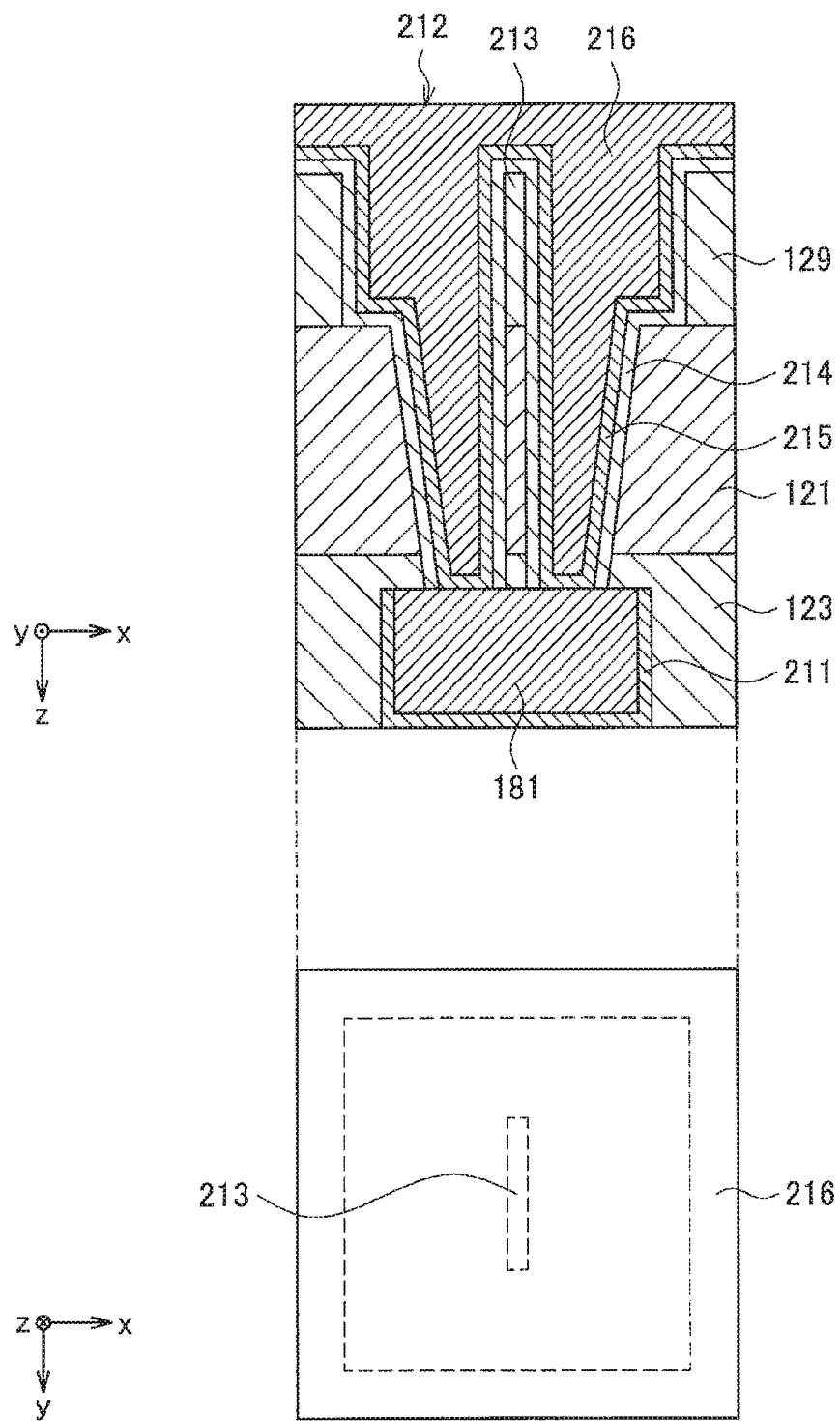
[FIG. 4C]

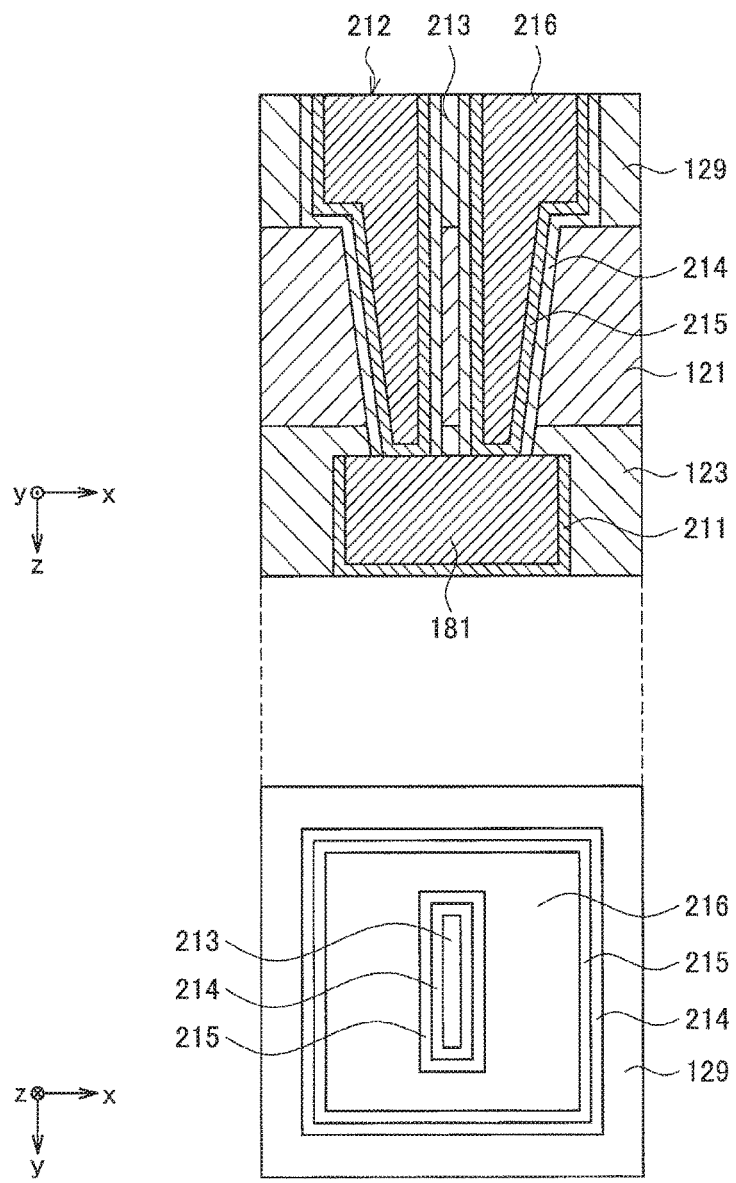

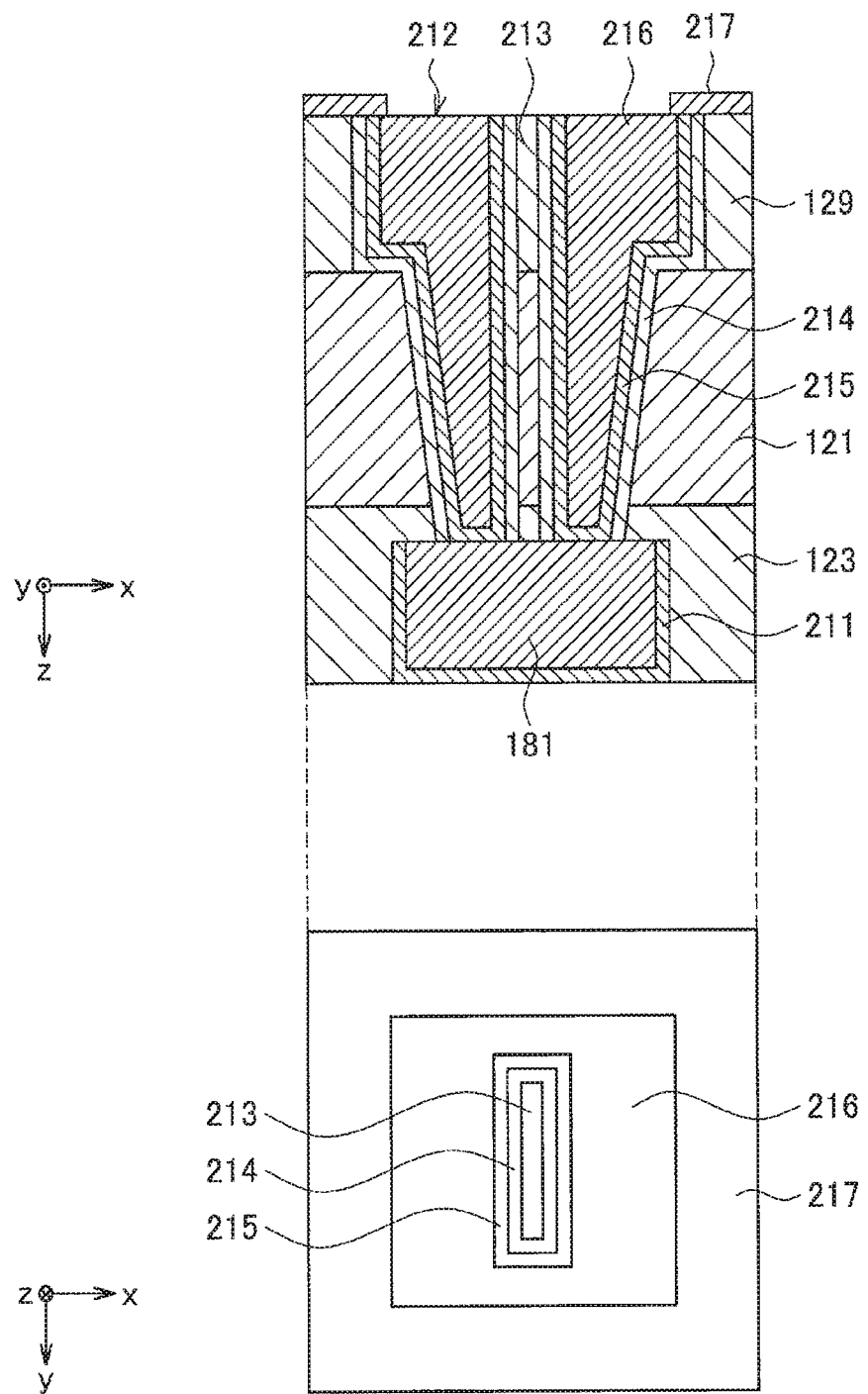
[FIG. 4E]

[FIG. 4F]
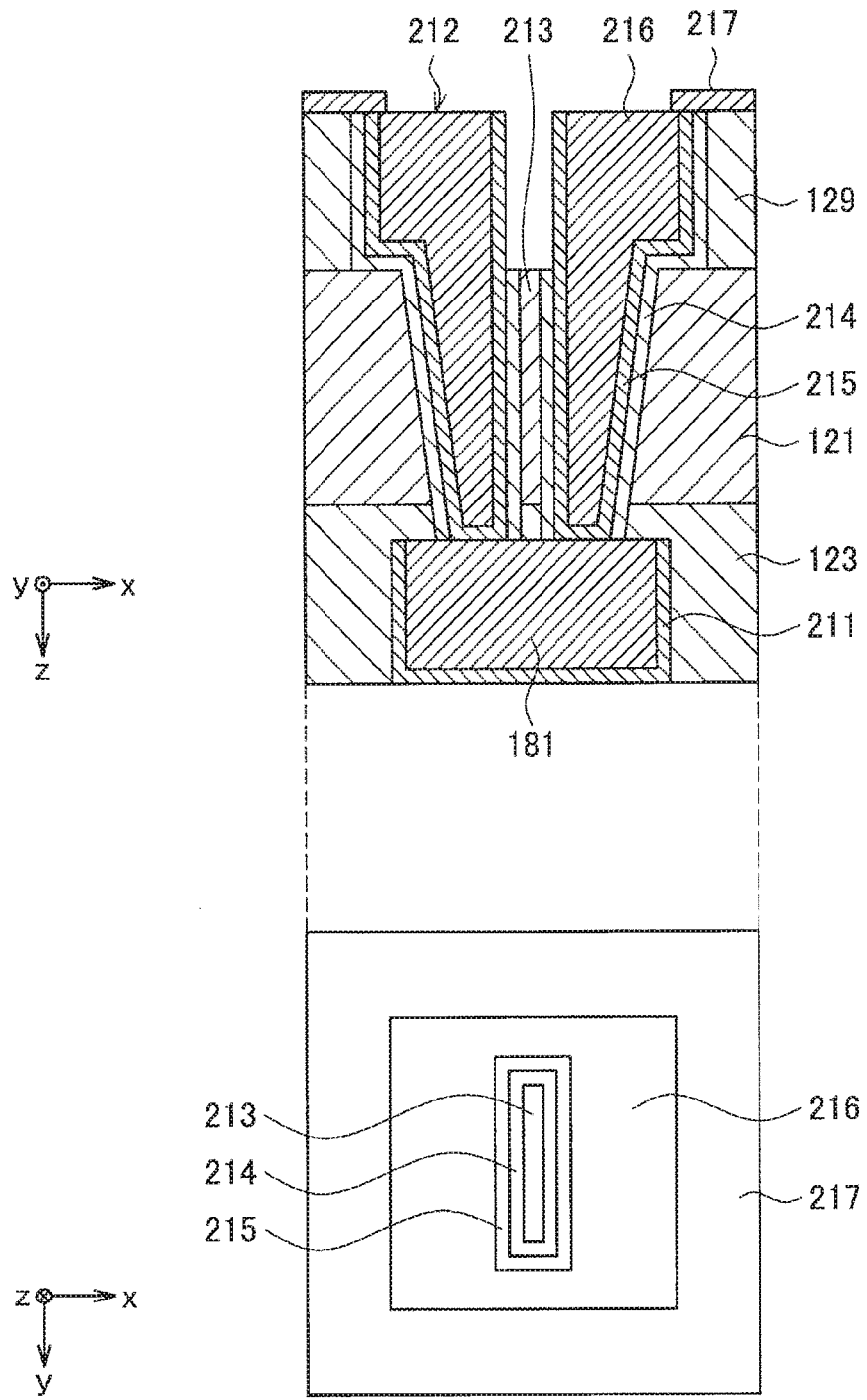

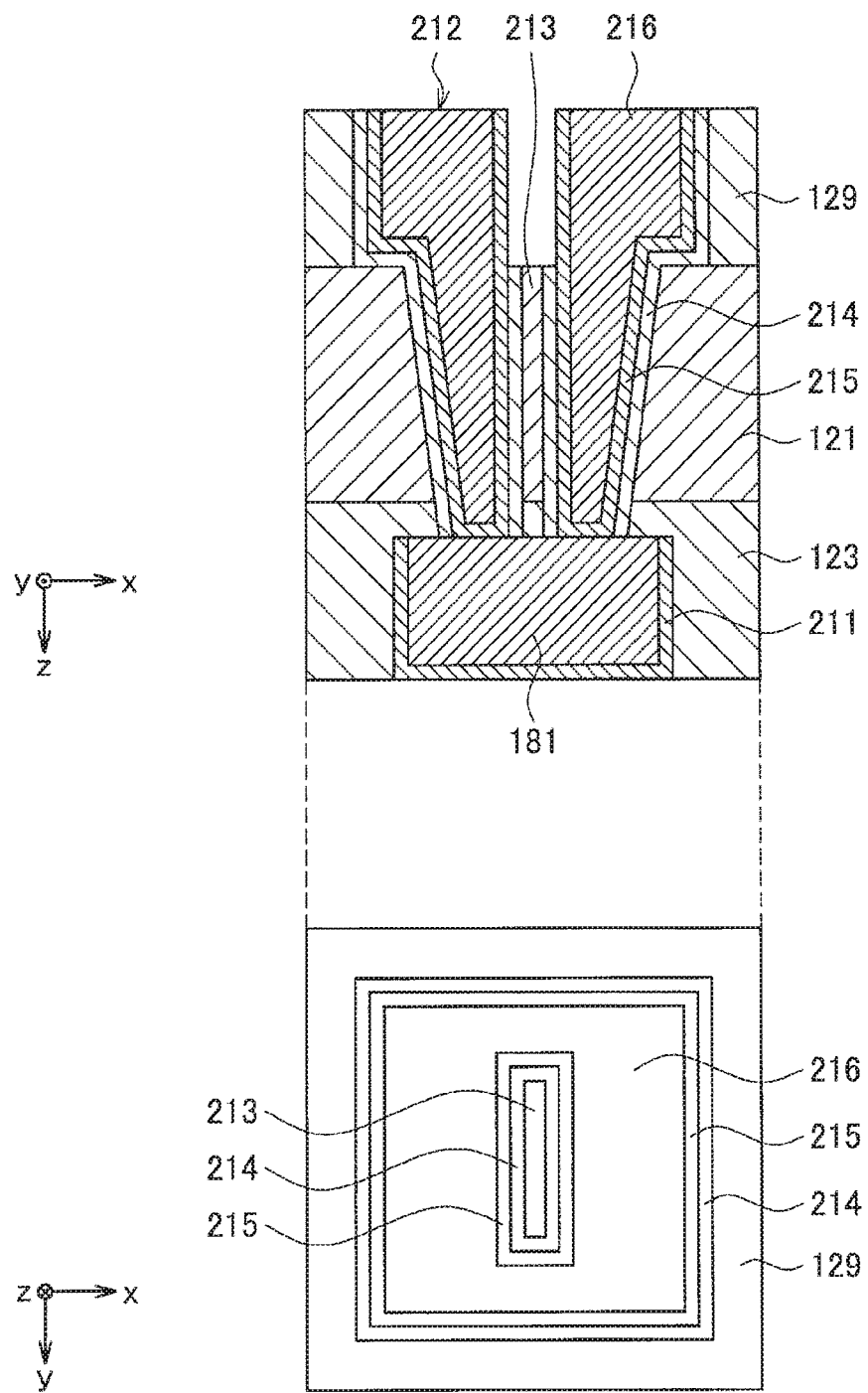
[FIG. 4G]

[FIG. 4H]
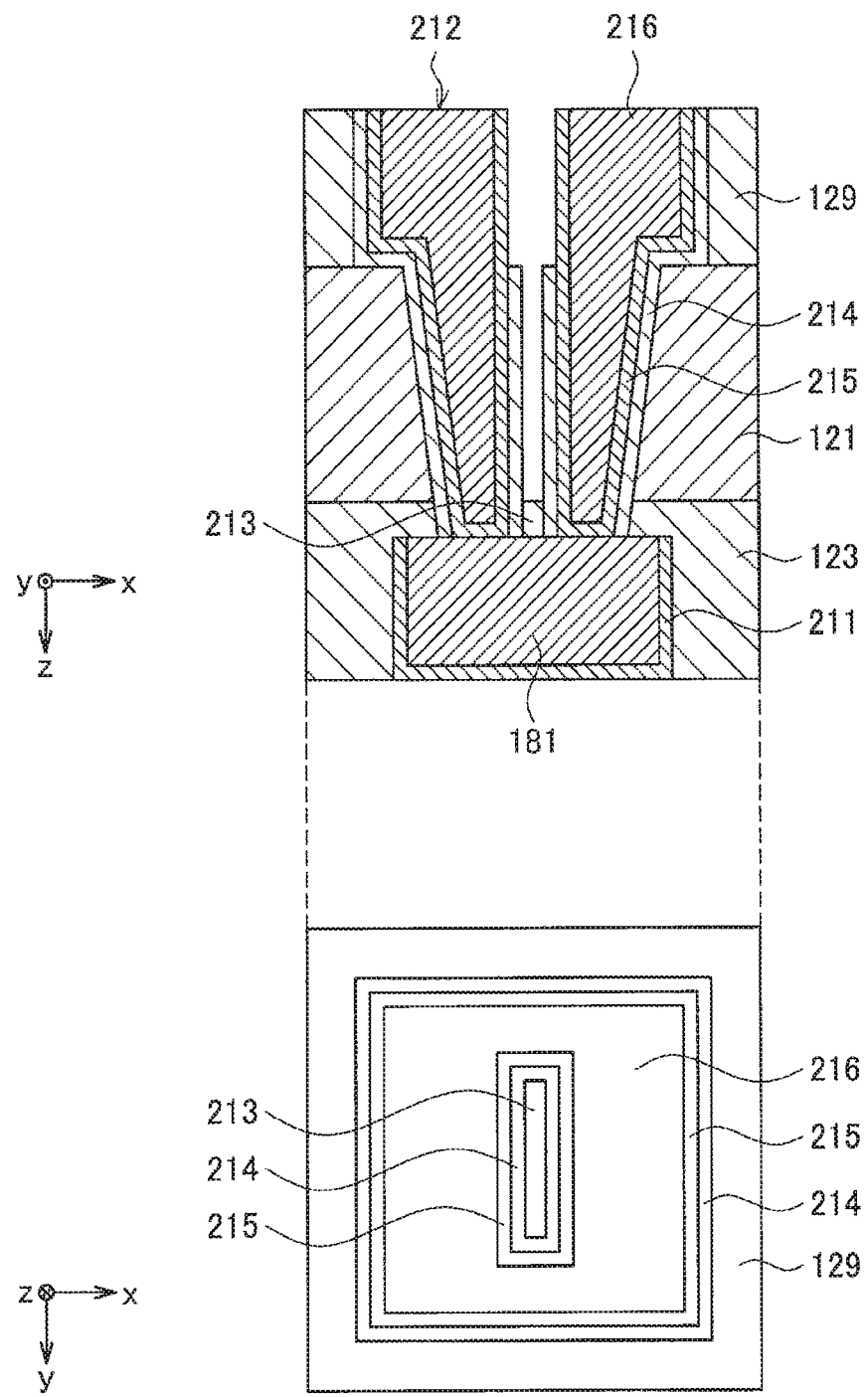

[FIG. 4I]
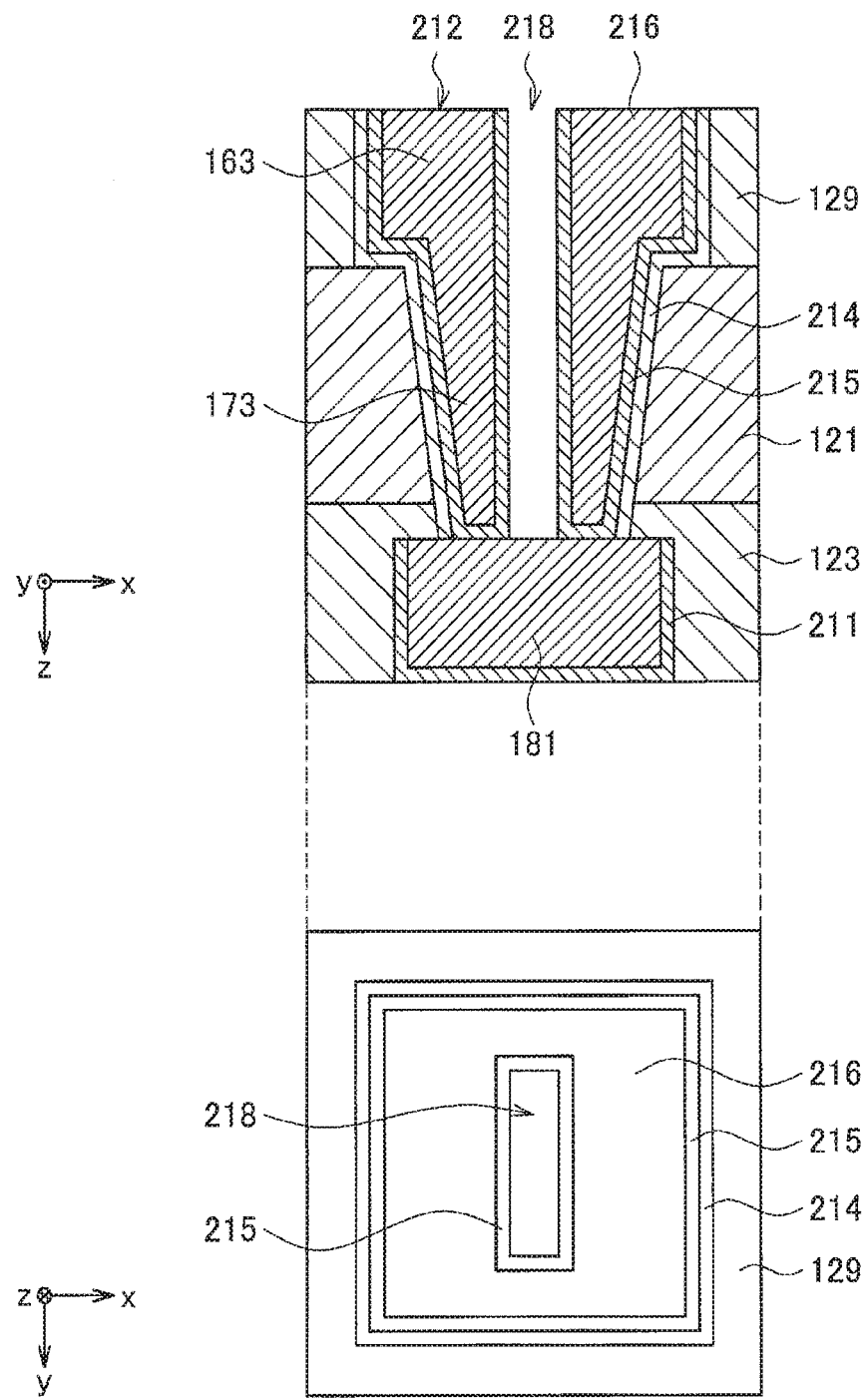

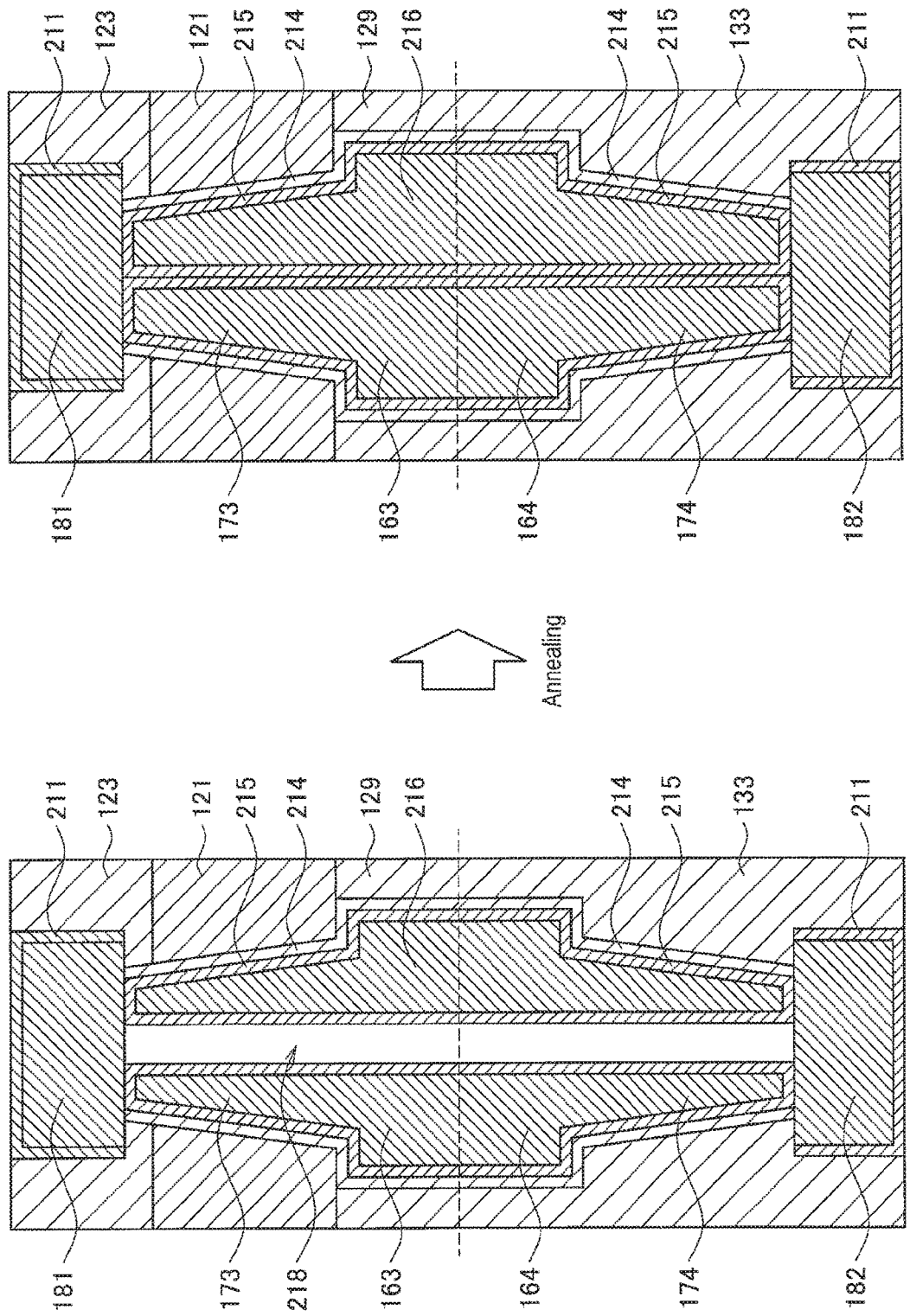

[FIG. 6]
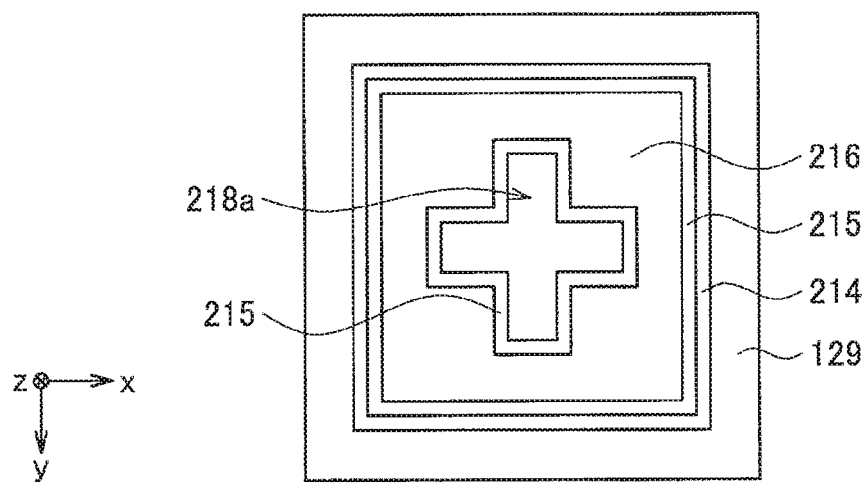
[FIG. 7]
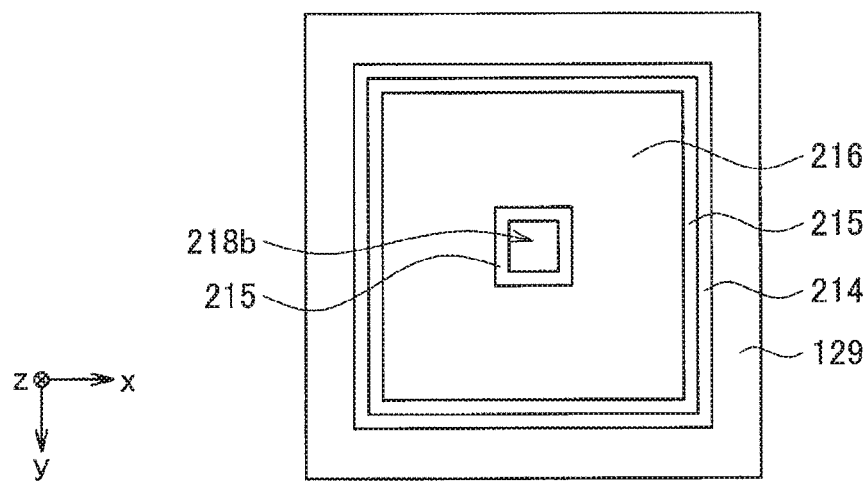

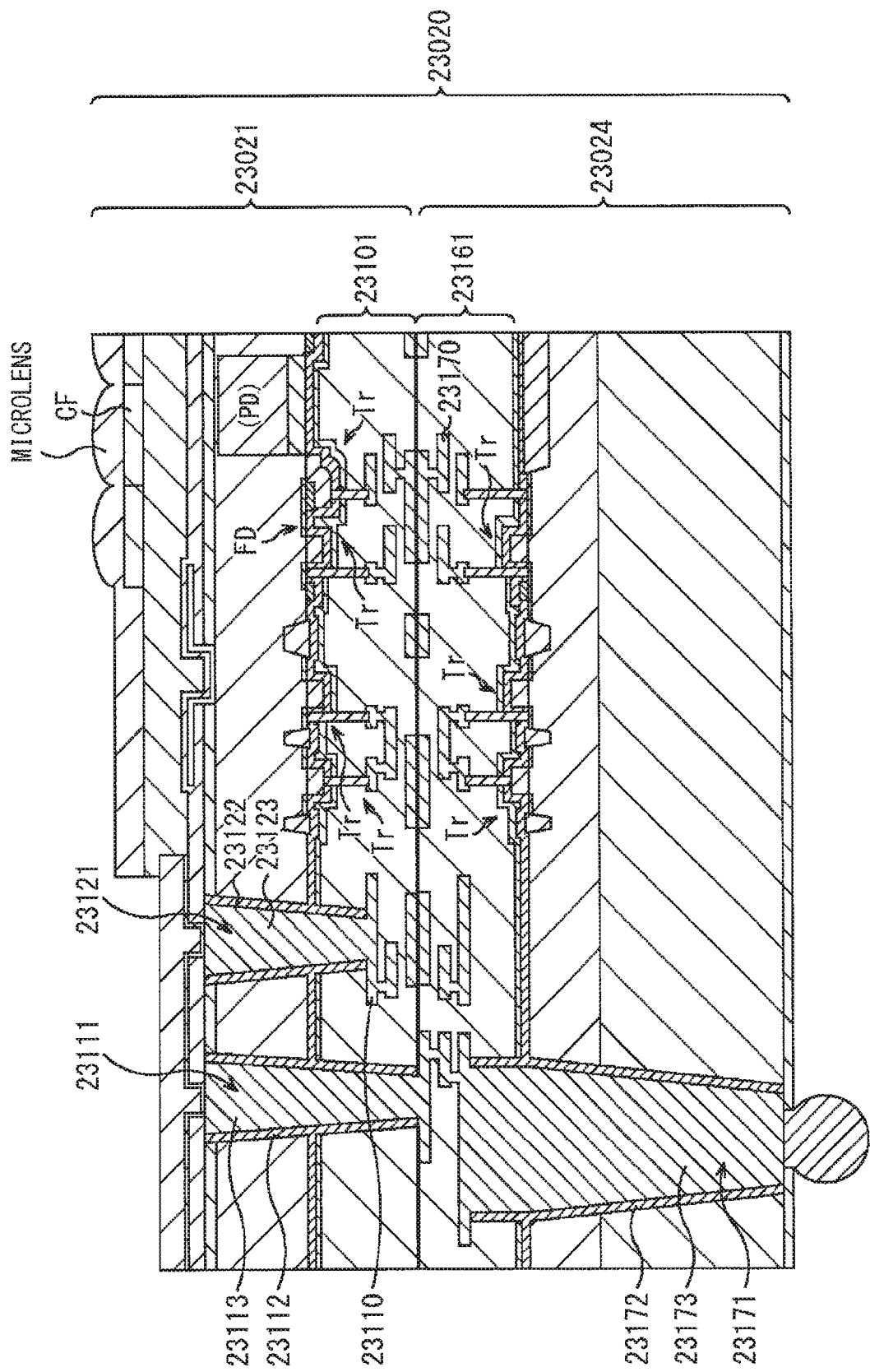
[FIG. 8]

[ FIG. 9 ]
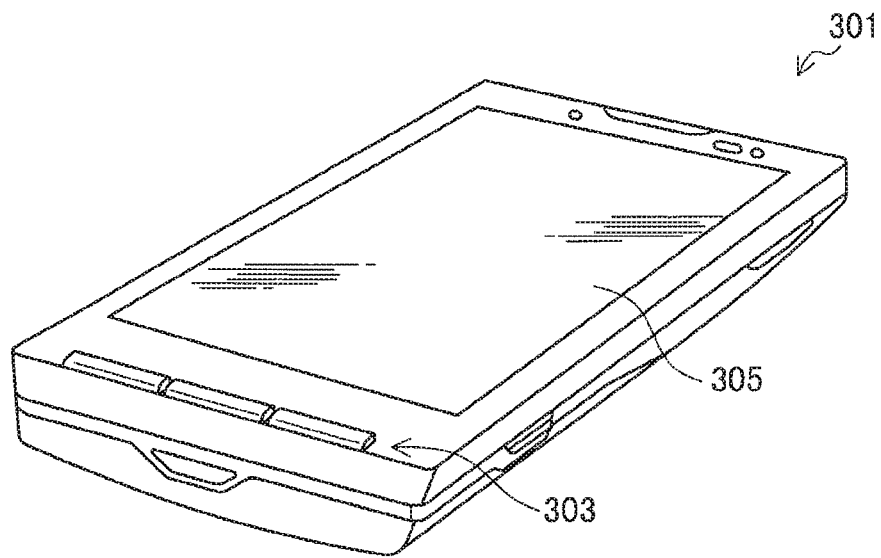
[ FIG. 10 ]
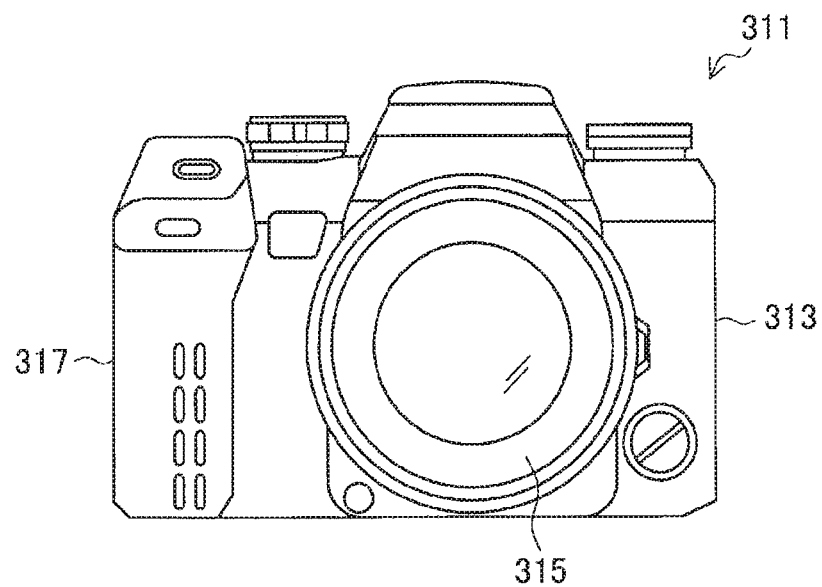

[ FIG. 11 ]
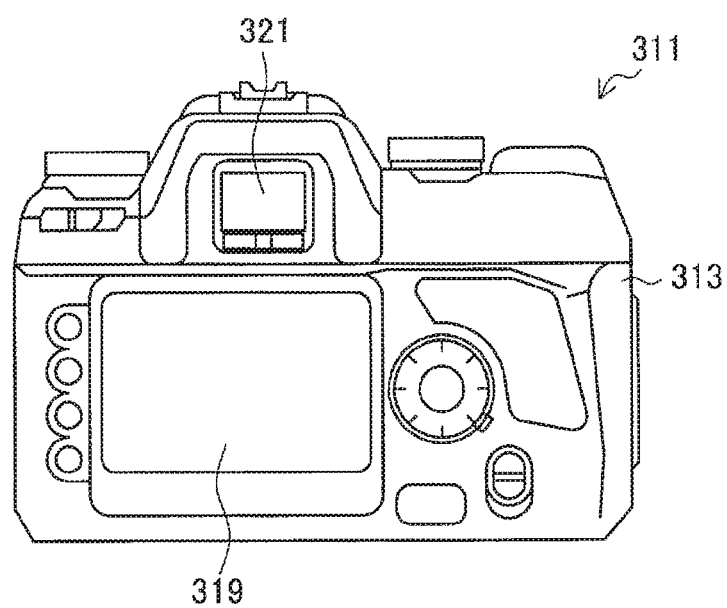

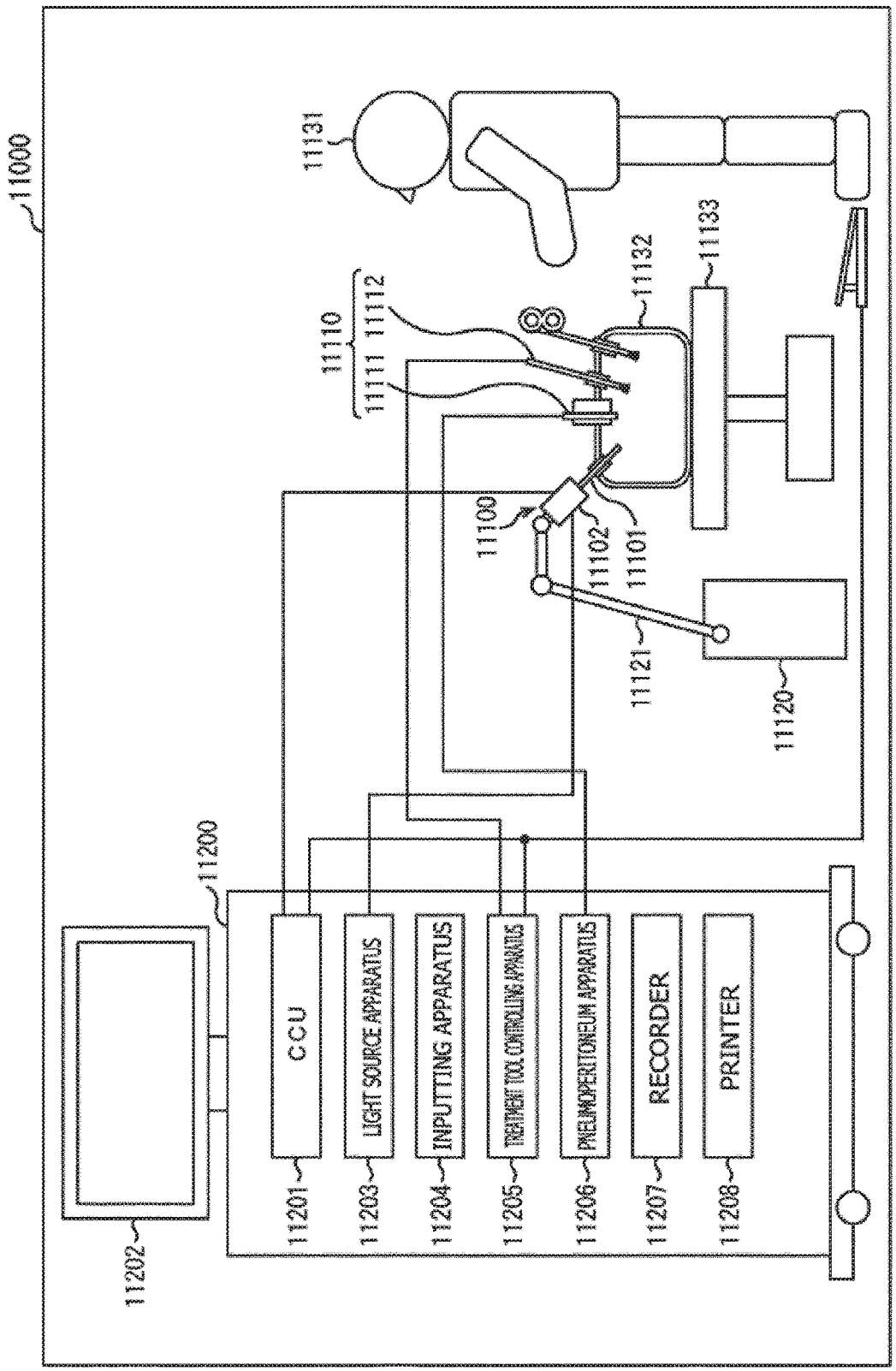
[FIG. 12]

[FIG. 13]
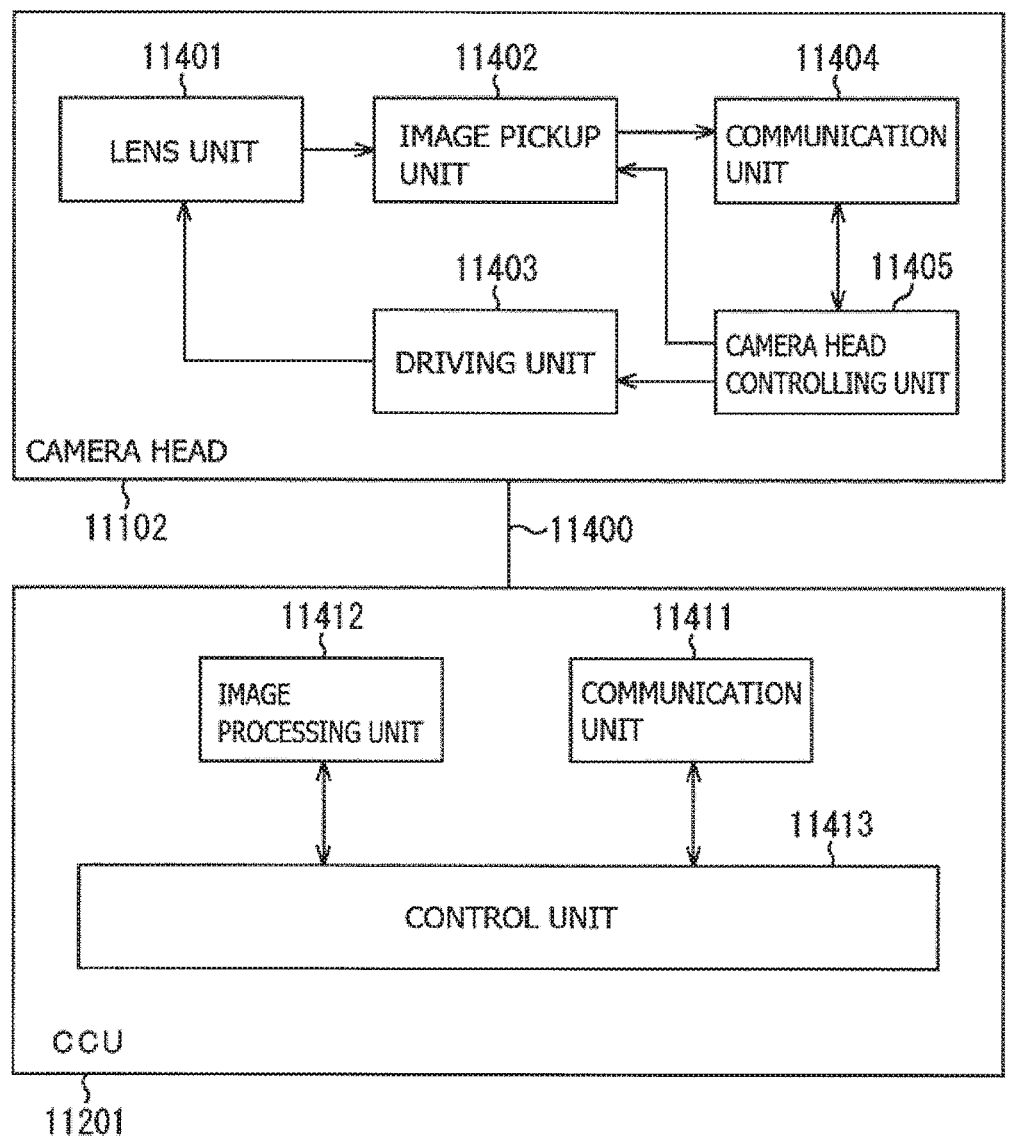

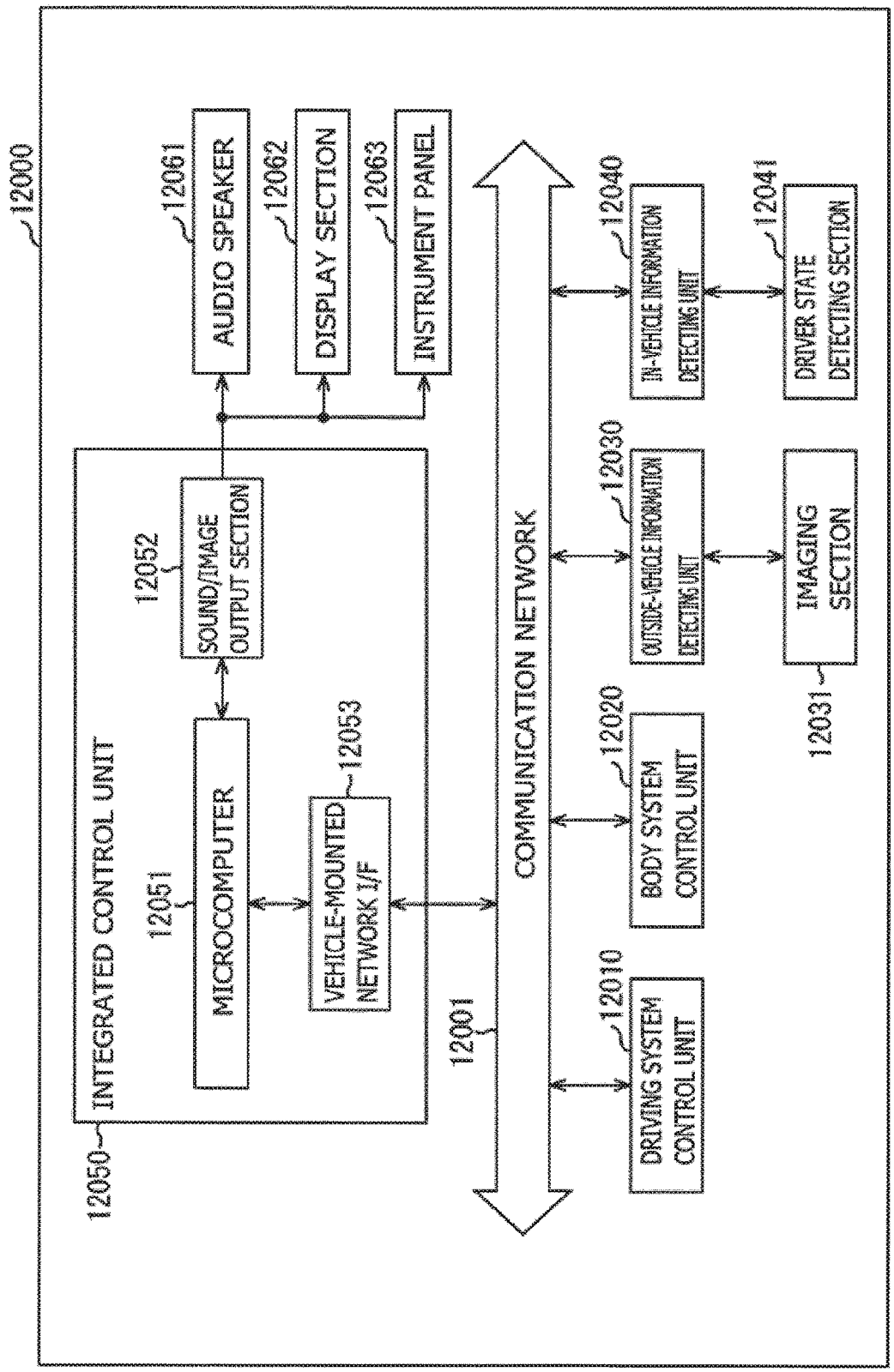
[FIG. 14]

[FIG. 15]
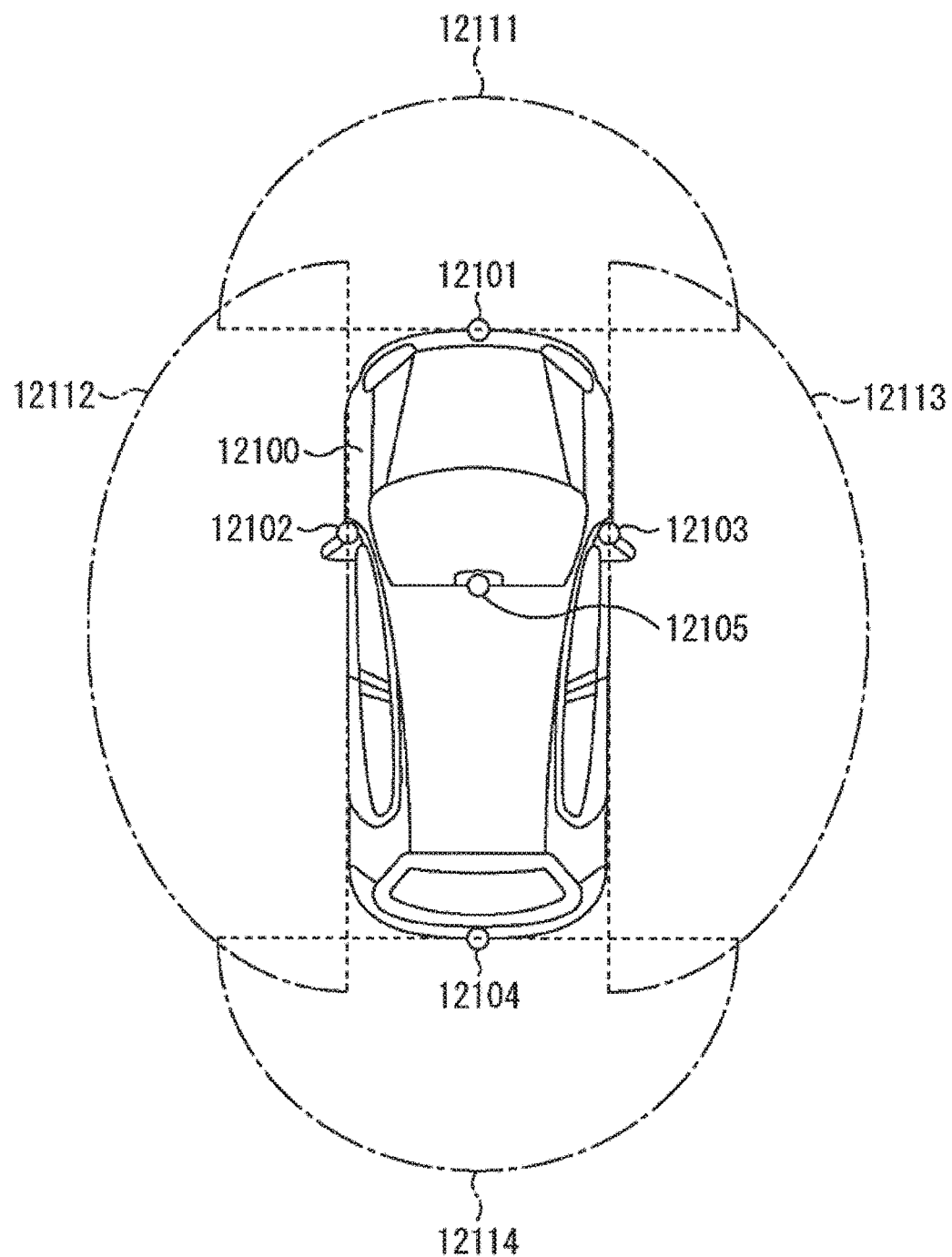

SEMICONDUCTOR DEVICE, METHOD OF MANUFACTURING SEMICONDUCTOR DEVICE, AND ELECTRONIC APPARATUS

CROSS REFERENCE TO RELATED APPLICATIONS

This application is a U.S. National Phase of International Patent Application No. PCT/JP2018/005279 filed on Feb. 15, 2018, which claims priority benefit of Japanese Patent Application No. JP 2017-080689 filed in the Japan Patent Office on Apr. 14, 2017 and also claims priority benefit of Japanese Patent Application No. JP 2017-074801 filed in the Japan Patent Office on Apr. 4, 2017. Each of the above-referenced applications is hereby incorporated herein by reference in its entirety.

TECHNICAL FIELD

The present disclosure relates to a semiconductor device, a method of manufacturing a semiconductor device, and an electronic apparatus.

BACKGROUND ART

In order to achieve high integration, a stacked semiconductor device in which a plurality of chips is stacked has been developed. For example, PTL 1 discloses a three-layer stacked solid-state imaging device including a stack of a pixel chip provided with a pixel unit, a logic chip equipped with a logic circuit that performs various kinds of signal processing related to operation of the solid-state imaging device, and a memory chip equipped with a memory circuit that holds a pixel signal acquired in the pixel.

Note that, in describing a structure of a semiconductor device in this specification, a component in which a semiconductor substrate and a multi-layered wiring layer formed on the semiconductor substrate, which constitute each chip to be stacked, are combined is also referred to as a "substrate". Further, the "substrates" are referred to as a "first substrate", a "second substrate", a "third substrate", and so on, in order from the upper side to the lower side in the stack structure, to be distinguished from each other. Note that a stacked semiconductor device is manufactured by stacking each substrate in a wafer state and then dicing the substrates into a plurality of stacked semiconductor devices (stacked semiconductor device chips). In this specification, for convenience, the term "substrate" may mean a wafer state before dicing or a chip state after dicing.

CITATION LIST

Patent Literature

PTL 1: Japanese Unexamined Patent Application Publication No. 2014-99582.

SUMMARY OF THE INVENTION

Problem to be Solved by the Invention

In order to electrically couple wiring lines between stacked substrates in a stacked semiconductor device, a method sometimes used is to bond these substrates together so that electrodes provided on bonding surfaces of the substrates come into contact with each other, and then perform heat treatment to join the electrodes to each other. At this time, if an abnormality occurs in a shape of the electrode, a defect can occur in the joining between the electrodes, which can hinder normal operation of the semiconductor device.

In view of the above circumstances, there has been a demand for a technology that achieves a semiconductor device with higher reliability by satisfactorily joining electrodes in bonding substrates together in a stacked semiconductor device. Hence, the present disclosure proposes a semiconductor device, a method of manufacturing the semiconductor device, and an electronic apparatus that are novel and improved and make it possible to further improve reliability.

Means for Solving the Problem

According to the present disclosure, there is provided a semiconductor device including a plurality of substrates that is stacked, each of the substrates including a semiconductor substrate and a multi-layered wiring layer stacked on the semiconductor substrate, the semiconductor substrate having a circuit with a predetermined function formed thereon. Bonding surfaces between at least two substrates among the plurality of substrates have an electrode junction structure in which electrodes formed on the respective bonding surfaces are joined in direct contact with each other, the electrode junction structure being a structure for electrical connection between the two substrates. In at least one of the two substrates, at least one of the electrode constituting the electrode junction structure or a via for connection of the electrode to a wiring line in the multi-layered wiring layer has a structure in which a protective film for prevention of diffusion of an electrically-conductive material constituting the electrode and the via is embedded inside the electrically-conductive material.

Further, according to the present disclosure, there is provided a method of manufacturing a semiconductor device, including steps of: preparing a plurality of substrates, each of the substrates including a semiconductor substrate and a multi-layered wiring layer stacked on the semiconductor substrate, the semiconductor substrate having a circuit with a predetermined function formed thereon; and stacking the plurality of substrates. Bonding surfaces between at least two substrates among the plurality of substrates have an electrode junction structure in which electrodes formed on the respective bonding surfaces are joined in direct contact with each other, the electrode junction structure being a structure for electrical connection between the two substrates. A step of forming, in at least one of the two substrates, the electrode constituting the electrode junction structure and a via for connection of the electrode to a wiring line in the multi-layered wiring layer includes steps of forming a through hole that extends from one surface of the substrate to the wiring line, with a columnar portion having a columnar shape left in a partial region inside the through hole, forming a protective film for prevention of diffusion of an electrically-conductive material constituting the electrode and the via on at least a sidewall of the through hole and a sidewall of the columnar portion, embedding the electrically-conductive material in the through hole, and removing the columnar portion to form a space whose side surface is surrounded by the protective film in a region where the columnar portion was present.

Further, according to the present disclosure, there is provided an electronic apparatus with a solid-state imaging device that electronically images an observation object, the solid-state imaging device including a plurality of substrates that is stacked, each of the substrates including a semiconductor substrate and a multi-layered wiring layer stacked on the semiconductor substrate, the semiconductor substrate having a circuit with a predetermined function formed thereon. Bonding surfaces between at least two substrates among the plurality of substrates have an electrode junction structure in which electrodes formed on the respective bonding surfaces are joined in direct contact with each other, the electrode junction structure being a structure for electrical connection between the two substrates. In at least one of the two substrates, at least one of the electrode constituting the electrode junction structure or a via for connection of the electrode to a wiring line in the multi-layered wiring layer has a structure in which a protective film for prevention of diffusion of an electrically-conductive material constituting the electrode and the via is embedded inside the electrically-conductive material.

According to the present disclosure, a stacked semiconductor device is provided with an electrode junction structure for electrically coupling two stacked substrates. Further, in at least one of the two substrates, at least one of the electrode constituting the electrode junction structure or a via for coupling the electrode to a wiring line in a multi-layered wiring layer of the substrate has a space inside an electrically-conductive material constituting the electrode and the via, the space having a side surface surrounded by a protective film for preventing diffusion of the electrically-conductive material. With such a configuration, even if the electrically-conductive material constituting the electrode and the via thermally expands in a heat treatment step for forming the electrode junction structure, the expansion is absorbed by the space. This makes it possible to suppress the occurrence of a phenomenon in which an electrode projects toward another electrode to be joined (i.e., pumping). Therefore, the electrode junction structure is able to be formed more stably, and the risk of the substrates peeling off from each other by pumping is able to be reduced. This enables a semiconductor device with higher reliability to be achieved.

Effects of the Invention

As described above, according to the present disclosure, it is possible to further improve reliability in a semiconductor device. Noted that the effects described above are not necessarily limitative. With or in the place of the above effects, there may be achieved any one of the effects described in this specification or other effects that may be grasped from this specification.

BRIEF DESCRIPTION OF DRAWINGS

FIG. 1 is a vertical cross-sectional view of a schematic configuration of a semiconductor device according to the present embodiment.

FIG. 2A is a diagram for describing an existing method of forming a via and an electrode constituting an electrode junction structure.

FIG. 2B is a diagram for describing an existing method of forming a via and an electrode constituting an electrode junction structure.

FIG. 2C is a diagram for describing an existing method of forming a via and an electrode constituting an electrode junction structure.

FIG. 2D is a diagram for describing an existing method of forming a via and an electrode constituting an electrode junction structure.

FIG. 3 is a diagram for describing pumping of electrodes.

FIG. 4A is a diagram for describing a method of forming a via and an electrode constituting an electrode junction structure according to the present embodiment.

FIG. 4B is a diagram for describing a method of forming a via and an electrode constituting an electrode junction structure according to the present embodiment.

FIG. 4C is a diagram for describing a method of forming a via and an electrode constituting an electrode junction structure according to the present embodiment.

FIG. 4D is a diagram for describing a method of forming a via and an electrode constituting an electrode junction structure according to the present embodiment.

FIG. 4E is a diagram for describing a method of forming a via and an electrode constituting an electrode junction structure according to the present embodiment.

FIG. 4F is a diagram for describing a method of forming a via and an electrode constituting an electrode junction structure according to the present embodiment.

FIG. 4G is a diagram for describing a method of forming a via and an electrode constituting an electrode junction structure according to the present embodiment.

FIG. 4H is a diagram for describing a method of forming a via and an electrode constituting an electrode junction structure according to the present embodiment.

FIG. 4I is a diagram for describing a method of forming a via and an electrode constituting an electrode junction structure according to the present embodiment.

FIG. 5 is a diagram for describing a behavior of Cu at the time of heat treatment in a via and an electrode of a second substrate and a via and an electrode of a third substrate that are formed by a formation method according to the present embodiment.

FIG. 6 illustrates another configuration example of a columnar portion and a space.

FIG. 7 illustrates another configuration example of a columnar portion and a space.

FIG. 8 is a cross-sectional view of a configuration example of a stacked solid-state imaging device 23020.

FIG. 9 illustrates an appearance of a smartphone, which is an example of an electronic apparatus to which a semiconductor device according to the present embodiment is applicable.

FIG. 10 illustrates an appearance of a digital camera, which is an example of an electronic apparatus to which a semiconductor device according to the present embodiment is applicable.

FIG. 11 illustrates an appearance of a digital camera, which is an example of an electronic apparatus to which a semiconductor device according to the present embodiment is applicable.

FIG. 12 is a view depicting an example of a schematic configuration of an endoscopic surgery system.

FIG. 13 is a block diagram depicting an example of a functional configuration of a camera head and a camera control unit (CCU).

FIG. 14 is a block diagram depicting an example of schematic configuration of a vehicle control system.

FIG. 15 is a diagram of assistance in explaining an example of installation positions of an outside-vehicle information detecting section and an imaging section.

MODES FOR CARRYING OUT THE INVENTION

Hereinafter, (a) preferred embodiment(s) of the present disclosure is described in detail with reference to the appended drawings. It is to be noted that, in this specification and the appended drawings, components that have substantially the same function and configuration are denoted with the same reference numerals, thereby refraining from repeatedly describing these components.

Note that, in the embodiment described below, a case where a semiconductor device is a solid-state imaging device will be described as an example. However, the present disclosure is not limited to such an example, and the technology according to the present disclosure is applicable to various semiconductor devices as long as the semiconductor device is of a stacked type in which a plurality of substrates is stacked.

In addition, in the drawings described below, the size of some components may be exaggerated for the sake of explanation. The relative sizes of the components illustrated in the drawings do not necessarily represent the exact size relationships between the actual components.

Note that description is given in the following order:
1. Overall Configuration of Semiconductor Device
2. Consideration of Existing Technologies
3. Method of Forming Electrode Junction Structure
4. Application Examples
5. Supplement (1. Overall Configuration of Semiconductor Device)

A configuration of a semiconductor device according to an embodiment of the present disclosure will be described with reference to FIG. 1. FIG. 1 is a vertical cross-sectional view of a schematic configuration of a semiconductor device according to the present embodiment.

As illustrated in FIG. 1, the semiconductor device 1 according to the present embodiment is a three-layer stacked solid-state imaging device in which a first substrate 110A, a second substrate 110B, and a third substrate 110C are stacked. In the drawing, a broken line A-A indicates bonding surfaces between the first substrate 110A and the second substrate 110B, and a broken line B-B indicates bonding surfaces between the second substrate 110B and the third substrate 110C. The first substrate 110A is a pixel substrate provided with a pixel unit. The second substrate 110B and the third substrate 110C are provided with circuits for performing various kinds of signal processing related to the operation of the semiconductor device 1. The second substrate 110B and the third substrate 110C are, for example, a logic substrate provided with a logic circuit or a memory substrate provided with a memory circuit. The semiconductor device 1 is a back-illuminated CMOS (Complementary Metal-Oxide-Semiconductor) image sensor that photoelectrically converts, in the pixel unit, light entering from a back surface side, which will be described later, of the first substrate 110A. Note that, in the following description of FIG. 1, a case where the second substrate 110B is a logic substrate and the third substrate 110C is a memory substrate will be described as an example.

In the stacked semiconductor device 1, it is possible to configure each circuit more appropriately so as to adapt to the function of the corresponding substrate, which enables the semiconductor device 1 to offer higher performance more easily. In the illustrated configuration example, it is possible to configure the pixel unit in the first substrate 110A and the logic circuit or the memory circuit in the second substrate 110B and the third substrate 110C appropriately so as to adapt to the function of each substrate, which enables the semiconductor device 1 to offer high performance.

Note that, hereinafter, a stacking direction of the first substrate 110A, the second substrate 110B, and the third substrate 110C is also referred to as a z-axis direction. In addition, a direction in which the first substrate 110A is located in the z-axis direction is defined as a positive direction of the z-axis. In addition, two directions orthogonal to each other on a plane (horizontal plane) perpendicular to the z-axis direction are also referred to as an x-axis direction and a y-axis direction, respectively. Further, in the following description, in each substrate, the side on which Si substrates 101, 121, and 131 to be described later are provided is also referred to as the back surface side, and the side on which multi-layered wiring layers 105, 125, and 135 to be described later are provided is also referred to as a front surface side.

The first substrate 110A mainly includes the silicon substrate 101 (Si substrate 101), which is an example of a semiconductor substrate, and the multi-layered wiring layer 105 stacked on the Si substrate 101. On the Si substrate 101, a pixel unit in which pixels are two-dimensionally arranged and a pixel signal-processing circuit that processes pixel signals are mainly formed. Each pixel mainly includes a photodiode (PD) that receives light (observation light) from an observation object and performs photoelectric conversion, and a drive circuit including a transistor or the like for reading out an electric signal (pixel signal) corresponding to the observation light acquired by the PD. In the pixel signal-processing circuit, various kinds of signal processing such as analog-to-digital conversion (AD conversion), for example, are performed on the pixel signals. Note that, in the present embodiment, the pixel unit is not limited to including two-dimensionally arranged pixels, and may include three-dimensionally arranged pixels. In addition, in the present embodiment, a substrate including a semiconductor material other than Si may be used instead of the Si substrate 101. Alternatively, a substrate including a material other than a semiconductor may be used instead of the Si substrate 101. For example, a sapphire substrate may be used as a substrate including a material other than a semiconductor. In this case, a film that performs photoelectric conversion (e.g., an organic photoelectric conversion film) may be deposited on the sapphire substrate to form a pixel.

An insulating film 103 is stacked on a surface of the Si substrate 101 on which the pixel unit and the pixel signal-processing circuit are formed. The insulating film 103 includes, for example, a silicon oxide ($SiO_2$). Inside the insulating film 103 is formed the multi-layered wiring layer 105 including signal line wiring for transmitting various signals, such as a pixel signal and a drive signal for driving a transistor of the drive circuit. The multi-layered wiring layer 105 further includes a power supply wiring line, a ground wiring line (GND wiring line), and the like. Note that, in the following description, the signal line wiring may be simply referred to as signal lines for simplicity. In addition, the power supply wiring line and the GND wiring line are sometimes collectively referred to as a power supply line. A wiring line in the lowermost layer of the multi-layered wiring layer 105 may be electrically coupled to the pixel unit or the pixel signal-processing circuit by a contact 107 filled with an electrically-conductive material such as tungsten (W), for example. Note that a plurality of wiring layers may actually be formed by repeating the formation of an interlayer insulating film having a predetermined thickness and the formation of the wiring layer, but in FIG. 1, for simplicity, the plurality of layers of interlayer insulating films is collectively referred to as the insulating film 103, and the plurality of wiring layers is collectively referred to as the multi-layered wiring layer 105.

Note that, in the uppermost layer of the multi-layered wiring layer 105, an electrode 161 is formed so that its metal surface is exposed from the insulating film 103. The electrode 161 is electrically coupled to a predetermined wiring line of the multi-layered wiring layer 105 by a via 171. The electrode 161 constitutes an electrode junction structure 159a for electrically coupling the first substrate 110A and the second substrate 110B to each other in bonding these substrates together, as described later. Note that, in this specification, a wiring line in one substrate being electrically coupled to a wiring line in another substrate may be abbreviated for simplicity as the one substrate being electrically coupled to the other substrate. In this case, the wiring lines electrically coupled when the substrates are electrically coupled to each other may be a signal line or a power supply line.

The second substrate 110B is, for example, a logic substrate. The second substrate 110B mainly includes the Si substrate 121, which is an example of a semiconductor substrate, and the multi-layered wiring layer 125 stacked on the Si substrate 121. A logic circuit is formed on the Si substrate 121. The logic circuit performs various kinds of signal processing related to the operation of the semiconductor device 1. For example, the logic circuit may control a drive signal for driving the pixel unit of the first substrate 110A (i.e., control driving of the pixel unit), and control exchange of signals with the outside. Note that, in the present embodiment, a substrate including a semiconductor material other than Si may be used instead of the Si substrate 121. Alternatively, a substrate including a material other than a semiconductor may be used instead of the Si substrate 121. For example, a sapphire substrate may be used as a substrate including a material other than a semiconductor. In this case, a semiconductor film (e.g., a Si film) may be deposited on the sapphire substrate, and a logic circuit may be formed in the semiconductor film.

An insulating film 123 is stacked on a surface of the Si substrate 121 on which the logic circuit is formed. The insulating film 123 includes, for example, $SiO_2$. Inside the insulating film 123 is formed the multi-layered wiring layer 125 for transmitting various signals related to the operation of the logic circuit. The multi-layered wiring layer 125 further includes a power supply wiring line, a GND wiring line, and the like. A wiring line in the lowermost layer of the multi-layered wiring layer 125 may be electrically coupled to the logic circuit by a contact 127 filled with an electrically-conductive material such as W, for example. Note that, also in the second substrate 110B, the insulating film 123 may be a collective term of a plurality of layers of interlayer insulating films, and the multi-layered wiring layer 125 may be a collective term of a plurality of wiring layers, as with the insulating film 103 and the multi-layered wiring layer 105 of the first substrate 110A.

Note that, in the uppermost layer of the multi-layered wiring layer 125, an electrode 162 is formed so that its metal surface is exposed from the insulating film 123. The electrode 162 is electrically coupled to a predetermined wiring line of the multi-layered wiring layer 125 by a via 172. The electrode 162 constitutes the electrode junction structure 159a for electrically coupling the first substrate 110A and the second substrate 110B to each other in bonding these substrates together, as described later. In addition, in the multi-layered wiring layer 125 may be formed a pad 151 that functions as an external input/output unit (I/O unit) for exchanging various signals, such as a power supply signal and a GND signal, with the outside. The pad 151 may be provided in a region along the outer periphery of the chip.

The third substrate 110C is, for example, a memory substrate. The third substrate 110C mainly includes the Si substrate 131, which is an example of a semiconductor substrate, and the multi-layered wiring layer 135 stacked on the Si substrate 131. A memory circuit is formed on the Si substrate 131. The memory circuit temporarily holds pixel signals acquired in the pixel unit of the first substrate 110A and AD-converted by the pixel signal-processing circuit. Temporarily holding pixel signals in the memory circuit allows for a global shutter system, and enables the pixel signals to be read out from the semiconductor device 1 to the outside at higher speed. Therefore, even at the time of high-speed imaging, it is possible to capture an image of higher quality in which distortion is suppressed. Note that, in the present embodiment, a substrate including a semiconductor material other than Si may be used instead of the Si substrate 131. Alternatively, a substrate including a material other than a semiconductor may be used instead of the Si substrate 131. For example, a sapphire substrate may be used as a substrate including a material other than a semiconductor. In this case, a film for forming a memory element (e.g., a phase change material film) may be deposited on the sapphire substrate, and a memory circuit may be formed using the film.

An insulating film 133 is stacked on a surface of the Si substrate 131 on which the memory circuit is formed. The insulating film 133 includes, for example, $SiO_2$. Inside the insulating film 133 is formed the multi-layered wiring layer 135 for transmitting various signals related to the operation of the memory circuit. The multi-layered wiring layer 135 further includes a power supply wiring line, a GND wiring line, and the like. A wiring line in the lowermost layer of the multi-layered wiring layer 135 may be electrically coupled to the memory circuit by a contact 137 filled with an electrically-conductive material such as W, for example. Note that, also in the third substrate 110C, the insulating film 133 may be a collective term of a plurality of layers of interlayer insulating films, and the multi-layered wiring layer 135 may be a collective term of a plurality of wiring layers, as with the insulating film 103 and the multi-layered wiring layer 105 of the first substrate 110A.

Note that, in the uppermost layer of the multi-layered wiring layer 135, an electrode 164 is formed so that its metal surface is exposed from the insulating film 133. The electrode 164 is electrically coupled to a predetermined wiring line of the multi-layered wiring layer 135 by a via 174. The electrode 164 constitutes an electrode junction structure 159b for electrically coupling the second substrate 110B and the third substrate 110C to each other in bonding these substrates together, as described later. In addition, in the multi-layered wiring layer 135 may be formed the pad 151 that functions as an I/O unit. The pad 151 may be provided in a region along the outer periphery of the chip.

The first substrate 110A, the second substrate 110B, and the third substrate 110C are each prepared in a wafer state. Thereafter, these substrates are bonded together, and steps for establishing an electrical connection are performed.

Specifically, first, the second substrate 110B in a wafer state and the third substrate 110C in a wafer state are bonded together so that the back surface (the surface on the side provided with the Si substrate 121) of the second substrate 110B faces the front surface (the surface on the side provided with the multi-layered wiring layer 135) of the third substrate 110C. Hereinafter, such a state in which two substrates are bonded together with their front and back surfaces facing each other is also referred to as Face to Back (F to B).

At this time, before the bonding step, the Si substrate 121 of the second substrate 110B is thinned, and an insulating film 129 with a predetermined thickness including $SiO_2$, for example, is formed on the back surface side thereof. Further, in the insulating film 129, an electrode 163 is formed so that its metal surface is exposed from the insulating film 129. The electrode 163 is electrically coupled to a predetermined wiring line in the multi-layered wiring layer 125 by a via 173 (i.e., a TSV) provided to penetrate the Si substrate 121. For example, a support substrate may be bonded to the front surface side of the second substrate 110B, and the thinning of the Si substrate 121, the formation of the insulating film 129, and the formation of the electrode 163 and the via 173 may be performed while the second substrate 110B is supported by the support substrate.

In bonding the second substrate 110B and the front surface of the third substrate 110C together, the second substrate 110B and the third substrate 110C are bonded together so that the electrode 163 formed on the back surface of the second substrate 110B comes into contact with the electrode 164 formed in the uppermost layer of the multi-layered wiring layer 135 of the third substrate 110C. Then, by performing heat treatment (e.g., annealing), the electrodes are joined to each other, and the second substrate 110B and the third substrate 110C are electrically coupled to each other. In this specification, such a structure for electrically coupling substrates, in which electrodes are directly joined to each other, is also referred to as an electrode junction structure. Hereinafter, the electrode junction structure between the second substrate 110B and the third substrate 110C is also referred to as the electrode junction structure 159b to be distinguished from the electrode junction structure between the first substrate 110A and the second substrate 110B, which is to be described later. Note that, in a case where there is no particular need to distinguish between the two electrode junction structures, one or both of them are simply referred to as electrode junction structures 159.

Note that, in the electrode junction structure 159b, it is not necessary for a wiring line in the multi-layered wiring layer 125 of the second substrate 110B and a wiring line in the multi-layered wiring layer 135 of the third substrate 110C, which are present at substantially the same position in the horizontal plane, to be electrically coupled to each other. In other words, in the electrode junction structure 159b, one or both of the electrodes 163 and 164 constituting the electrode junction structure 159b may be formed to extend in a direction in the horizontal plane, and a wiring line in the multi-layered wiring layer 125 and a wiring line in the multi-layered wiring layer 135, which are present at different positions in the horizontal plane, may be electrically coupled to each other. In this case, the one or both of the electrodes 163 and 164 that extend in a direction in the horizontal plane are able to have a function as a wiring line as well as a function as an electrode. In the illustrated example, the electrode 163 extends in a direction in the horizontal plane and also functions as a wiring line in the electrode junction structure 159b located on the rightmost side, out of three electrode junction structures 159b illustrated in FIG. 1.

Next, the first substrate 110A in a wafer state and the stack structure of the second substrate 110B and the third substrate 110C in a wafer state are bonded together so that the front surface (the surface on the side provided with the multi-layered wiring layer 105) of the first substrate 110A faces the front surface (the surface on the side provided with the multi-layered wiring layer 125) of the second substrate 110B. Hereinafter, such a state in which two substrates are bonded together with their front surfaces facing each other is also referred to as Face to Face (F to F).

At this time, the first substrate 110A and the second substrate 110B are bonded together so that the electrode 161 in the uppermost layer of the multi-layered wiring layer 105 of the first substrate 110A comes into contact with the electrode 162 in the uppermost layer of the multi-layered wiring layer 125 of the second substrate 110B. Then, by performing heat treatment (e.g., annealing), the electrodes are joined to each other to form the electrode junction structure 159a, and the first substrate 110A and the second substrate 110B are electrically coupled to each other. Note that heat treatment for forming the electrode junction structures 159a and 159b may be performed collectively after the first substrate 110A, the second substrate 110B, and the third substrate 110C are bonded to each other.

Note that also in the electrode junction structure 159a, one or both of the electrodes 161 and 162 constituting the electrode junction structure 159a may be formed to extend in a direction in the horizontal plane and may function as a wiring line, as in the electrode junction structure 159b. In the illustrated example, the electrode 161 extends in a direction in the horizontal plane and also functions as a wiring line in the electrode junction structure 159a located on the left side, out of two electrode junction structures 159a illustrated in FIG. 1.

Next, the Si substrate 101 of the first substrate 110A is thinned, and an insulating film 109 including $SiO_2$, for example, is formed on the back surface thereof. Then, a color filter layer 111 (CF layer 111) and a microlens array 113 (ML array 113) are formed on the back surface side of the Si substrate 101 of the first substrate 110A with the insulating film 109 interposed therebetween.

The CF layer 111 includes a plurality of two-dimensionally arranged CFs. The ML array 113 includes a plurality of two-dimensionally arranged MLs. The CF layer 111 and the ML array 113 are formed directly above the pixel unit, and one CF and one ML are provided for a PD of one pixel.

Each CF of the CF layer 111 has a color of, for example, one of red, green, and blue. Observation light that has passed through the CF enters the PD of the pixel, and a pixel signal is acquired; thus, a pixel signal of the color component of the color filter is acquired for an observation object (i.e., color imaging is able to be performed). Actually, one pixel corresponding to one CF may function as a sub-pixel, and a plurality of sub-pixels may form one pixel. For example, in the semiconductor device 1, one pixel may include sub-pixels of four colors: a pixel provided with a red CF (i.e., a red pixel), a pixel provided with a green CF (i.e., a green pixel), a pixel provided with a blue CF (i.e., a blue pixel), and a pixel provided with no CF (i.e., a white pixel). Note that, in this specification, a sub-pixel is not distinguished from a pixel, and a component corresponding to one sub-pixel is also simply referred to as a pixel, for convenience of description. Note that how to arrange the CFs is not particularly limited, and examples may include various arrangements such as a delta arrangement, a stripe arrangement, a diagonal arrangement, and a rectangular arrangement.

The ML array 113 is formed so that each ML is located directly above the corresponding CF. Providing the ML array 113 causes the observation light collected by the ML to enter the PD of the pixel through the CF, which makes it possible to obtain an effect of improving efficiency of collecting the observation light and improving sensitivity.

After the CF layer 111 and the ML array 113 are formed, pad openings 153b and 153a are then formed to expose surfaces of the pads 151 that are provided in the multi-layered wiring layer 125 of the second substrate 110B and the multi-layered wiring layer 135 of the third substrate 110C. The pad opening 153b is formed from the back surface side of the first substrate 110A, penetrating the first substrate 110A, to reach the pad 151 provided in the multi-layered wiring layer 125 of the second substrate 110B. The pad opening 153a is formed from the back surface side of the first substrate 110A, penetrating the first substrate 110A and the second substrate 110B, to reach the pad 151 provided in the multi-layered wiring layer 135 of the third substrate 110C. The pads 151 are electrically coupled to another external circuit through the pad openings 153a and 153b by, for example, wire bonding. In other words, the second substrate 110B and the third substrate 110C may be electrically coupled to each other through the other external circuit.

Then, the stacked wafer structure stacked and processed in a wafer state is diced for each individual semiconductor device 1; thus, the semiconductor device 1 is completed.

The schematic configuration of the semiconductor device 1 has been described above. As described above, in the semiconductor device 1, the first substrate 110A and the second substrate 110B are electrically coupled by the electrode junction structure 159a, the second substrate 110B and the third substrate 110C are electrically coupled by the electrode junction structure 159b, and the pads 151 exposed by the pad openings 153a and 153b are coupled to each other through an electrical connection means, such as a wiring line or a substrate, provided outside the semiconductor device 1, thereby electrically coupling the second substrate 110B and the third substrate 110C. In other words, the first substrate 110A, the second substrate 110B, and the third substrate 110C are electrically coupled to each other through the electrode junction structures 159a and 159b, the pads 151, and the pad openings 153a and 153b.

Note that the multi-layered wiring layer 105 of the first substrate 110A, the multi-layered wiring layer 125 of the second substrate 110B, and the multi-layered wiring layer 135 of the third substrate 110C may include a stack of a plurality of Cu wiring layers 141 including copper (Cu) having a relatively low resistance. The use of Cu wiring lines makes it possible to exchange signals at a higher speed. Cu is also used as a metal constituting the electrodes 161 to 164 and a metal embedded in the vias 171 to 174, which constitute the electrode junction structures 159a and 159b. However, the pads 151 may include aluminum (Al) in consideration of adhesiveness to a wire of wire bonding, or the like. Therefore, in the illustrated configuration example, the multi-layered wiring layer 125 of the second substrate 110B and the multi-layered wiring layer 135 of the third substrate 110C, in which the pads 151 are provided, may each include an Al wiring layer 143 including Al in the same layer as the pad 151. In addition to the pads 151, an Al wiring line may be used, for example, as a power supply wiring line or a GND wiring line, which is generally formed as a wide wiring line.

Note that specific configurations and formation methods of the components formed on the Si substrates 101, 121, and 131 of the respective substrates (the pixel unit and the pixel signal-processing circuit provided in the first substrate 110A, the logic circuit provided in the second substrate 110B, and the memory circuit provided in the third substrate 110C), the multi-layered wiring layers 105, 125, and 135, and the insulating films 103, 109, 123, 129, and 133 may be similar to various well-known configurations and methods; therefore, detailed description thereof is omitted here.

For example, although $SiO_2$ is used as the insulating material constituting the insulating films 103, 109, 123, 129, and 133 in the above description, the present embodiment is not limited to such an example. The insulating films 103, 109, 123, 129, and 133 may include any insulating material, and the material thereof is not limited. The insulating films 103, 109, 123, 129, and 133 may include, for example, silicon nitride (SiN). In addition, each of the insulating films 103, 109, 123, 129, and 133 need not include one type of insulating material, and may be formed by stacking a plurality of types of insulating materials. In addition, for example, an insulating Low-k material may be used in regions where wiring lines desired to transmit signals at higher speeds are formed in the insulating films 103, 123, and 133. Using a Low-k material enables parasitic capacitance between wiring lines to be reduced, which enables further contribution to high-speed transmission of signals.

Further, for example, although Cu and Al are used as the electrically-conductive materials constituting the wiring layers of the multi-layered wiring layers 105, 125, and 135 in the above description, the present embodiment is not limited to such an example. These wiring layers may include any electrically-conductive material, and the material thereof is not limited. Any of various electrically-conductive materials may be used as the material. Instead of using two types of metals, the pads 151 and the multi-layered wiring layers 105, 125, and 135 may all include the same metal.

In addition, as specific configurations and formation methods of the components formed on the Si substrates 101, 121, and 131 of the respective substrates, the multi-layered wiring layers 105, 125, and 135, and the insulating films 103, 109, 123, 129, and 133, for example, it is possible to appropriately apply those described in PTL 1, Japanese Unexamined Patent Application Publication No. 2014-72418, Japanese Unexamined Patent Application Publication No. 2015-135938, WO 2016/009832, and WO 2015/159766, which are prior applications filed by the present applicant, and the like.

In addition, in the above-described configuration example, the first substrate 110A is equipped with a pixel signal-processing circuit that performs signal processing such as AD conversion on pixel signals, but the present embodiment is not limited to this example. Part or all of the functions of the pixel signal-processing circuit may be provided in the second substrate 110B. In this case, for example, the semiconductor device 1 using a so-called pixel-by-pixel analog-to-digital conversion (pixel ADC) system may be achieved in which, in a pixel array in which a plurality of pixels is arranged in an array so as to be aligned in both a column direction and a row direction, a pixel signal acquired by a PD provided in each pixel is transmitted to a pixel signal-processing circuit of the second substrate 110B for each pixel, and is subjected to AD conversion for each pixel. This makes it possible to perform AD conversion and readout of pixel signals at higher speed as compared with the semiconductor device 1 using a typical column-by-column analog-to-digital conversion (column ADC) system in which one AD conversion circuit is provided for each column of the pixel array and AD conversion is sequentially performed on a plurality of pixels included in each column. Note that, in a case of configuring the semiconductor device 1 to enable pixel ADC to be performed, the electrode junction structure 159 that electrically couples the first substrate 110A and the second substrate 110B is provided for each pixel for transmission of a pixel signal.

In addition, in the configuration example described above, a case where the second substrate 110B is a logic substrate and the third substrate 110C is a memory substrate has been described, but the present embodiment is not limited to such an example. The second substrate 110B and the third substrate 110C may be any substrates having functions other than that of the pixel substrate, and the functions thereof may be freely determined. For example, the semiconductor device 1 may include no memory circuit. In this case, for example, both the second substrate 110B and the third substrate 110C may function as logic substrates. Alternatively, the logic circuit and the memory circuit may be formed in the second substrate 110B and the third substrate 110C in a distributed manner, and these substrates may cooperate to function as the logic substrate and the memory substrate. Alternatively, the second substrate 110B may be a memory substrate, and the third substrate 110C may be a logic substrate.

In addition, in the above-described configuration example, only the electrode 163 constituting the electrode junction structure 159b is formed in the insulating film 129 formed on the back surface of the second substrate 110B (i.e., only one wiring layer related to the electrode 163 is formed in the insulating film 129); however, the present embodiment is not limited to this example. A multi-layered wiring layer may be provided in the insulating film 129. Providing the multi-layered wiring layer in the insulating film 129 makes it possible to increase the number of wiring layers in the semiconductor device 1 as a whole, which improves the degree of freedom in designing wiring lines. Note that, in this case, a wiring layer functioning as the electrode 163 is formed in the uppermost layer of the multi-layered wiring layer so that the surface is exposed from the insulating film 129.

In addition, in the above-described configuration example, the Si substrates 101, 121, and 131 are used as the semiconductor substrates in the respective substrates, but the present embodiment is not limited to this example. Instead of the Si substrates 101, 121, and 131, other types of semiconductor substrates, such as gallium arsenide (GaAs) substrates and silicon carbide (SiC) substrates, may be used, for example. Alternatively, as described above, substrates including a material other than a semiconductor, such as sapphire substrates, for example, may be used instead of the Si substrates 101, 121, and 131.

In addition, in the configuration example described above, the semiconductor device 1 is manufactured by first bonding the second substrate 110B and the third substrate 110C together, and then bonding the first substrate 110A to the stack structure of the second substrate 110B and the third substrate 110C, but the present embodiment is not limited to this example. The order may be reversed to first bond the first substrate 110A and the second substrate 110B together, and then bond the third substrate 110C to the stack structure of the first substrate 110A and the second substrate 110B, thereby manufacturing the semiconductor device 1.

In addition, although illustration may be omitted in FIG. 1 and the subsequent drawings, in the semiconductor device 1, an insulating material for electrically insulating Cu and Al from the Si substrates 101, 121, and 131 is present in portions where Cu and Al are illustrated as being in contact with the Si substrates 101, 121, and 131. The insulating material may be any of various well-known materials, such as $SiO_2$ or SiN, for example. The insulating material may be interposed between the electrically-conductive materials and the Si substrates 101, 121, and 131, or may be present inside the Si substrates 101, 121, and 131 away from contact portions of the electrically-conductive materials and the Si substrates 101, 121, and 131. In addition, although illustration may be omitted in FIG. 1 and the subsequent drawings, a barrier metal is present in order to prevent diffusion of Cu in portions where Cu is in contact with the Si substrates 101, 121, and 131 or the insulating films 103, 109, 123, 129, and 133. Any of various well-known materials may be used as the barrier metal.

(2. Consideration of Existing Technologies)

In the semiconductor device 1 illustrated in FIG. 1, the first substrate 110A and the second substrate 110B are electrically coupled by the electrode junction structure 159a, and the second substrate 110B and the third substrate 110C are electrically coupled by the electrode junction structure 159b. Here, the electrode junction structure is a structure that is generally used for establishing electrical continuity between substrates also in existing stacked semiconductor devices. However, if vias and electrodes constituting an electrode junction structure are formed by an existing technology, there is a possibility that an abnormality occurs in a shape of the electrode and the electrode junction structure is not formed normally. Before describing a method of forming the electrode junction structure 159 according to the present embodiment in detail, a method of forming an existing electrode junction structure will be described here in order to make the present disclosure clearer.

Referring to FIGS. 2A, 2B, 2C, and 2D, a method of forming an existing electrode junction structure will be described. FIGS. 2A, 2B, 2C, and 2D are diagrams for describing an existing method of forming a via and an electrode constituting an electrode junction structure. FIGS. 2A, 2B, 2C, and 2D schematically illustrate cross-sections of a via and an electrode in a certain substrate constituting an electrode junction structure, the cross-sections being parallel to the z-axis direction, in the order of steps in a method of forming the via and the electrode, and represent a process flow in the formation method. FIGS. 2A, 2B, 2C, and 2D illustrate, as an example, a process flow assuming a case where the via 173 and the electrode 163 provided in the second substrate 110B of the semiconductor device 1 illustrated in FIG. 1 are formed by an existing technology. Hereinafter, the via 173 and the electrode 163 in a case of being formed by an existing formation method are also referred to as a via 205 and an electrode 206 to be distinguished from the via 173 and the electrode 163 according to the present embodiment. In other words, the process flow illustrated in FIGS. 2A, 2B, 2C, and 2D is a process flow related to an existing formation method in a case where the via 205 is formed from the back surface side of the Si substrate 121 of the second substrate 110B (the side on which the insulating film 129 is formed), penetrating the insulating film 129 and the Si substrate 121, to a predetermined wiring line of the multi-layered wiring layer 125, and the electrode 206 is formed in the insulating film 129 on the back surface side of the Si substrate 121 so that the electrode 206 is electrically coupled to the via 205 and its surface is exposed to the back surface side.

In the existing method of forming a via and an electrode, first, a through hole 201 is formed from the insulating film 129 on the back surface side of the Si substrate 121, penetrating the insulating film 129 and the Si substrate 121, to reach a wiring line 181 of the multi-layered wiring layer 125 (FIG. 2A). The wiring line 181 corresponds to the wiring line of the multi-layered wiring layer 125 to which the via 173 is electrically coupled, which is illustrated in FIG. 1.

Next, an insulating film 202 including $SiO_2$, for example, is formed on the sidewall and the bottom of the through hole 201 by a CVD (Chemical Vapor Deposition) method. The insulating film 202 is intended to electrically insulate the via 205 to be finally formed from the Si substrate 121. Next, the bottom of the insulating film 202 in the through hole 201 is removed by, for example, a dry etching method (i.e., the wiring line 181 is exposed at the bottom of the through hole 201). Next, in this state, a barrier metal film 203 is formed on the sidewall and the bottom of the through hole 201 by, for example, a sputtering method (FIG. 2B). As the barrier metal film 203, for example, titanium nitride (TiN), tantalum nitride (TaN), tungsten nitride (WN), or the like is deposited.

Next, a Cu seed is deposited on the sidewall and the bottom of the through hole 201 by, for example, a sputtering method, and then Cu 204 is embedded in the through hole 201 by a plating deposition method (FIG. 2C).

Then, the Cu 204 embedded in the through hole 201 and the surrounding insulating film 129 are planarized by CMP (Chemical Mechanical Polishing); thus, the via 205 and the electrode 206 exposed on the surface of the insulating film 129 are formed (FIG. 2D). In this manner, the via 205 and the electrode 206 are formed by a so-called Dual Damascene method.

Similarly, a via and an electrode corresponding to the via 174 and the electrode 164 are formed on the opposing third substrate 110C by an existing formation method (hereinafter, these are referred to as a via 207 and an electrode 208 as illustrated in FIG. 3 described later). Then, the second substrate 110B and the third substrate 110C are bonded to each other so that the electrode 206 formed in the second substrate 110B and the electrode 208 formed in the third substrate 110C come into contact with each other, and heat treatment is performed; thus, an electrode junction structure is formed.

Here, as described above, the via 205 and the electrode 206 are formed by embedding the Cu 204 in the through hole 201. Therefore, the total volume of Cu of the via 205 and the electrode 206 is relatively large. Similarly, the volume of Cu as a whole is relatively large also for the via 207 and the electrode 208 formed in the third substrate 110C. For example, in the example illustrated in FIG. 1, the vias 171 to 174 and the electrodes 161 to 164 have a length of about 7 μm, the electrodes 161 to 164 have a diameter of about 3 μm, and it is possible to say that the volume of Cu constituting them is relatively large.

Therefore, when the heat treatment for forming the electrode junction structure is performed, Cu constituting the via 205 and the electrode 206 of the second substrate 110B and Cu constituting the via 207 and the electrode 208 provided in the third substrate 110C thermally expand, and so-called pumping can occur in which the electrode 206 of the second substrate 110B and the electrode 208 of the third substrate 110C each project toward the opposing substrate, as illustrated in FIG. 3. FIG. 3 is a diagram for describing pumping of electrodes. FIG. 3 simulates a state in which pumping occurs in the electrode 206 of the second substrate 110B and the electrode 208 of the third substrate 110C. Note that, in FIG. 3, a wiring line 182 corresponds to the wiring line in the multi-layered wiring layer 135 of the third substrate 110C to which the via 174 is electrically coupled, which is illustrated in FIG. 1.

If pumping occurs, the electrodes 206 and 208 are not normally joined to each other, and in some cases, the bonded substrates 110B and 110C can peel off from each other. In other words, the occurrence of pumping in the electrodes 206 and 208 can cause a decrease in reliability of the semiconductor device. In a case where the above-described pixel ADC is applied, an electrode junction structure may be provided for each pixel in the pixel unit; hence, if pumping remarkably occurs in the plurality of electrode junction structures, a force causing the substrates 110B and 110C to peel off can act more greatly, which can increase the possibility of a decrease in reliability of the semiconductor device.

In view of the above circumstances, there has been a demand for a technology that achieves a semiconductor device with higher reliability by suppressing the occurrence of pumping in such an electrode junction structure in a stacked semiconductor device. Hence, the present inventors have intensively studied a technology for suppressing the occurrence of pumping in the electrode junction structure, and have consequently arrived at the present disclosure. The electrode junction structures 159a and 159b of the semiconductor device 1 illustrated in FIG. 1 are formed by a formation method according to a preferred embodiment of the present disclosure, which the present inventors have conceived. Therefore, the semiconductor device 1 is able to achieve higher reliability.

Hereinafter, a method of forming the electrode junction structures 159a and 159b according to the present embodiment will be described in detail. Note that, hereinafter, a method of forming the electrode junction structure 159b provided between the second substrate 110B and the third substrate 110C will be described as an example. However, the electrode junction structure 159a provided between the first substrate 110A and the second substrate 110B may also be formed similarly by the formation method according to the present embodiment.

(3. Method of Forming Electrode Junction Structure)

Referring to FIGS. 4A, 4B, 4C, 4D, 4E, 4F, 4G, 4H, and 4I, a method of forming the electrode junction structure 159b according to the present embodiment will be described. FIGS. 4A, 4B, 4C, 4D, 4E, 4F, 4G, 4H, and 4I are diagrams for describing a method of forming the via 173 and the electrode 163 that constitute the electrode junction structure 159b according to the present embodiment. FIGS. 4A, 4B, 4C, 4D, 4E, 4F, 4G, 4H, and 4I schematically illustrate a cross-sectional view parallel to the z-axis direction (upper stage in the drawing) and a top view (lower stage in the drawing) of the via 173 and the electrode 163 in the second substrate 110B of the semiconductor device 1 illustrated in FIG. 1, in the order of steps in a method of forming the via 173 and the electrode 163, and represent a process flow in the formation method.

In the method of forming the via 173 and the electrode 163 according to the present embodiment, first, a through hole 212 is formed from the insulating film 129 on the back surface side of the Si substrate 121, penetrating the insulating film 129 and the Si substrate 121, to reach the wiring line 181 of the multi-layered wiring layer 125 by, for example, a dry etching method (FIG. 4B). In this case, in the present embodiment, a portion that is not etched is left in a partial region inside the through hole 212. In other words, as illustrated in the drawing, when the through hole 212 is formed, a portion 213 having a columnar shape (hereinafter also referred to as a columnar portion 213) is formed in a partial region inside the through hole 212. In the illustrated example, the columnar portion 213 has a wall-like shape extending in the y-axis direction (i.e., one direction in the horizontal plane). The columnar portion 213 has a stack structure in which $SiO_2$ ($SiO_2$ of the insulating film 123), Si (Si of the Si substrate 121), and $SiO_2$ ($SiO_2$ of the insulating film 129) are stacked in this order on the wiring line 181.

Next, an insulating film 214 is formed on the sidewall and the bottom of the through hole 212 and the sidewall of the columnar portion 213 by, for example, a CVD method. The insulating film 214 may have a thickness substantially the same as a thickness of an insulating film that is usually applied in forming a TSV. The insulating film 214 includes, for example, $SiO_2$. The insulating film 214 is intended to electrically insulate the via 173 from the Si substrate 121. Next, the bottom of the insulating film 214 in the through hole 212 is removed by, for example, a dry etching method (i.e., the wiring line 181 is exposed at the bottom of the through hole 212). Next, in this state, a barrier metal film 215 is formed on the sidewall and the bottom of the through hole 212 by, for example, a sputtering method. The barrier metal film 215 includes a material similar to that of the barrier metal film 211. In addition, the barrier metal film 215 has a thickness of, for example, about 30 nm. Next, a Cu seed is deposited on the sidewall and the bottom of the through hole 212 by, for example, a sputtering method, and then Cu 216 is embedded in the through hole 212 by a plating deposition method (FIG. 4C).

Next, the Cu 216 embedded in the through hole 212 and the surrounding insulating film 214 are planarized by CMP (FIG. 4D). By this CMP step, the upper surface of the columnar portion 213 is also exposed.

Next, a resist material 217 is formed so that only the upper surface of the columnar portion 213 is open in portions where $SiO_2$ is exposed (i.e., so as to cover the upper surface of the insulating film 129) by a resist material application and exposure step (FIG. 4E).

Wet etching is then performed using a hydrofluoric acid (HF)-based etching solution (FIG. 4F). Thus, $SiO_2$ portions in an upper part of the columnar portion 213 (a $SiO_2$ portion related to the insulating film 129 and a $SiO_2$ portion related to the insulating film 214) are etched, as illustrated in FIG. 4F. Note that the etching solution used in the wet etching need not be an HF-based solution, and any of various etching solutions may be used as long as the etching solution has a high selectivity to $SiO_2$.

Next, the resist material 217 is removed (FIG. 4G).

Next, wet etching is performed using an alkaline-based etching solution (FIG. 4H). As the alkaline-based etching solution, for example, a solution of TMAH, KOH, ammonia, or the like is used. Thus, as illustrated in FIG. 4H, a Si portion of the columnar portion 213 (a Si portion related to the Si substrate 121) is etched. Note that the etching solution used in the wet etching need not be an alkaline-based solution, and any of various etching solutions may be used as long as the etching solution has a high selectivity to Si.

Next, a series of steps described referring to FIGS. 4E 4F, and 4G (i.e., forming the resist material 217 so as to cover the upper surface of the insulating film 129, wet etching using an HF-based etching solution, and removing the resist material 217) are performed again. Thus, as illustrated in FIG. 4I, SiO2 portions in a lower part of the columnar portion 213 (a SiO2 portion related to the insulating film 123 and a SiO2 portion related to the insulating film 214) are etched. Note that the etching solution used in the wet etching also need not be an HF-based solution, and any of various etching solutions may be used as long as the etching solution has a high selectivity to SiO2.

Through the above steps, the via 173 and the electrode 163 exposed on the surface of the insulating film 129 are formed. In this manner, the via 173 and the electrode 163 are formed by a so-called Dual Damascene method. Note that a step of removing the columnar portion 213 is additionally performed after embedding the Cu 216 in the through hole 212 and performing CMP.

In other words, the via 173 and the electrode 163 formed by the formation method according to the present embodiment have a space 218 formed therein by removing the columnar portion 213. The space 218 has a wall-like shape following the shape of the columnar portion 213. In addition, the space 218 may be a space whose side surface is surrounded by the barrier metal film 215, as illustrated in the drawing.

Although detailed description is omitted, the via 174 and the electrode 164 are formed in the third substrate 110C by a similar method. In other words, the via 174 and the electrode 164 have therein a space (the space 218 illustrated in FIG. 5 described later) whose side surface is surrounded by a barrier metal film. However, the via 174 does not penetrate the Si substrate 131 but is a via provided in the insulating film 133; hence, the through hole 212 to be filled with the Cu 216 for forming the via 174 and the electrode 164 is formed in the insulating film 133 including, for example, $SiO_2$. Thus, a columnar portion, which remains inside the through hole 212, includes $SiO_2$ ($SiO_2$ related to the insulating film 133). Therefore, in a step of removing the columnar portion, it is unnecessary to perform wet etching in multiple stages, and it is only necessary to perform wet etching on $SiO_2$.

Then, the second substrate 110B and the third substrate 110C are bonded to each other so that the electrode 163 formed in the second substrate 110B and the electrode 164 formed in the third substrate 110C come into contact with each other, and heat treatment (e.g., annealing) is performed to form the electrode junction structure 159*b*.

In this case, according to the present embodiment, the space 218 is present in both the inside of the via 173 and the electrode 163 and the inside of the via 174 and the electrode 164, as described above. Therefore, when the Cu 216 is thermally expanded by the heat treatment, the expanded Cu 216 is absorbed by the space 218 as illustrated in FIG. 5. Specifically, as illustrated in FIG. 5, when the Cu 216 is thermally expanded by the heat treatment, the Cu 216 expands in a direction in the horizontal plane so as to collapse the space 218. In other words, the thermal expansion of the Cu 216 may extend in a direction in the horizontal plane. This suppresses expansion of the electrodes 163 and 164 in the z-axis direction, in other words, suppresses occurrence of pumping. Here, FIG. 5 is a diagram for describing the behavior of the Cu 216 at the time of the heat treatment in the via 173 and the electrode 163 of the second substrate 110B and the via 174 and the electrode 164 of the third substrate 110C that are formed by the formation method according to the present embodiment.

Note that, as illustrated in FIG. 5, the vias 173 and 174 and the electrodes 163 and 164 (i.e., the electrode junction structure 159*b*) after the heat treatment is performed have a structure in which the barrier metal film 215 is embedded inside the Cu 216 constituting the vias 173 and 174 and the electrodes 163 and 164. Specifically, since the space 218 has a wall-like shape extending in the y-axis direction following the shape of the columnar portion 213, the space 218 is collapsed by the thermally expanded Cu 216, so that after the heat treatment, the barrier metal film 215 having a linear shape extending in the y-axis direction as viewed from the z-axis direction is present so as to be embedded inside the Cu 216.

Note that, although detailed description is omitted, in the present embodiment, the electrode junction structure 159*a* provided between the first substrate 110A and the second substrate 110B may also be formed similarly by the formation method according to the present embodiment described above. This makes it possible to suitably suppress the occurrence of pumping also in the electrode junction structure 159*a*.

As described above, according to the present embodiment, providing the space 218 inside the vias 171 to 174 and the electrodes 161 to 164 suppresses the occurrence of pumping in the electrodes 161 to 164. This enables the electrode junction structures 159a and 159b to be formed more stably, and enables the risk of the substrates peeling off from each other to be reduced. Therefore, it is possible to manufacture the semiconductor device 1 with higher reliability.

Note that the volume of the space 218 may be determined as appropriate, in consideration of the thermal expansion coefficient of the Cu 216, the total volume of the Cu 216 in the vias 171 to 174 and the electrodes 161 to 164, the shapes of the vias 171 to 174 and the electrodes 161 to 164, conditions (temperature, time, etc.) of the heat treatment, and the like, so as to absorb the amount of the Cu 216 expansion upon thermal expansion. Then, the volume of the columnar portion 213 may also be appropriately determined so as to achieve the volume of the space 218.

In addition, for the electrode junction structures 159a and 159b, various well-known steps generally used for forming electrode junction structures may be applied to the steps other than the step of providing the columnar portion 213 and the step of removing the columnar portion 213. For example, the material of the insulating film 214 is not limited to $SiO_2$ and may be another insulating material such as SiN, and the thickness thereof may be determined as appropriate to reliably ensure the property of insulating the via 173 from the Si substrate 121. Further, for example, the materials of the barrier metal films 211 and 215 are not limited to those described above and may be any of various materials generally used as a barrier metal for Cu wiring lines, and the thicknesses thereof may be determined as appropriate to reliably prevent diffusion of the Cu 216 of the vias 171 to 174 and the electrodes 161 to 164. In addition, a film including a nonmetallic material that is able to prevent diffusion of Cu may be used instead of the barrier metal films 211 and 215. Examples of such a nonmetallic material include SiN. In other words, any of various well-known materials may be used as the protective film for preventing the diffusion of Cu.

Note that, as described referring to FIG. 1, the insulating films 123 and 129 may be insulating materials other than $SiO_2$ in the present embodiment. In addition, instead of the Si substrate 121, a semiconductor substrate including a material other than Si may be used. However, since the columnar portion 213 includes the materials of the insulating films 123 and 129 and the Si substrate 121, it is preferable to use a material that is able to be etched relatively easily as the materials of the insulating films 123 and 129 and the Si substrate 121, in consideration of the necessity of removing the columnar portion 213. Note that the method of removing the columnar portion 213 does not have to be wet etching, and for example, the columnar portion 213 may be removed by dry etching.

In addition, in the above-described configuration example, the columnar portion 213 has a wall-like shape, and the space 218 also has a wall-like shape accordingly, but the present embodiment is not limited to such an example. The columnar portion 213 and the space 218 may be freely changed in shape as long as they have a volume sufficient to absorb the amount of the Cu 216 expansion upon thermal expansion. FIGS. 6 and 7 illustrate another configuration example of the columnar portion 213 and the space 218. FIGS. 6 and 7 illustrate top views of the vias 171 to 174 and the electrodes 161 to 164 at the stage where the vias 171 to 174 and the electrodes 161 to 164 are formed (i.e., having the space 218). As illustrated in FIG. 6, a space 218a may be formed so as to have a shape in which wall-like spaces extending in two directions (x-axis direction and y-axis direction) orthogonal to each other in the horizontal plane intersect (i.e., so as to have a cross-like shape as viewed from the z-axis direction). Alternatively, as illustrated in FIG. 7, a space 218b may be formed as a columnar space having a substantially square shape as viewed from the z-axis direction.

Note that, in a case where the space 218a illustrated in FIG. 6 is formed, the space 218a is collapsed by the thermally expanded Cu 216, so that after the heat treatment for forming the electrode junction structure, the barrier metal film 215 having a substantially dot-like shape as viewed from the z-axis direction may be present so as to be embedded inside the Cu 216. In addition, in a case where the space 218b illustrated in FIG. 7 is formed, the space 218b is collapsed by the thermally expanded Cu 216, so that after the heat treatment for forming the electrode junction structure, the barrier metal film 215 having a substantially cross-like shape in which substantially linear shapes extending in two directions (x-axis direction and y-axis direction) orthogonal to each other in the horizontal plane intersect as viewed from the z-axis direction is present so as to be embedded inside the Cu 216.

The method of forming the electrode junction structure 159 in the present embodiment has been described above. As described above, according to the present embodiment, in forming the vias 171 to 174 and the electrodes 161 to 164 constituting the electrode junction structures 159, the space 218 is formed inside the Cu 216 embedded in the through hole 212. Since the space 218 is able to absorb the Cu 216 expanded by the heat treatment in forming the electrode junction structures 159, having the space 218 makes it possible to suppress expansion (i.e., pumping) of the Cu 216 in the stacking direction of the substrates. This enables the electrode junction structures 159 to be more stable junctions, and enables the risk of the substrates peeling off from each other to be reduced. Therefore, the semiconductor device 1 with higher reliability is able to be achieved.

Note that, as described above, in a case where the semiconductor device 1 is configured so that pixel ADC is applied, it is necessary to form the electrode junction structure 159a for each pixel of the pixel unit, which increases the number of the electrode junction structures 159a, and in a case where pumping occurs, there is a possibility that the first substrate 110A and the second substrate 110B easily peel off from each other. On the other hand, according to the present embodiment, it is possible to suitably suppress the occurrence of pumping as described above, which makes it possible to reduce the risk of the first substrate 110A and the second substrate 110B peeling off from each other in a case where pixel ADC is applied. In other words, it is possible to say that the method of forming the electrode junction structure 159 according to the present embodiment is able to particularly exert its effect in a stacked solid-state imaging device to which pixel ADC is applied.

Further, it is considered that the larger the volume of the Cu 216 in the vias 171 to 174 and the electrodes 161 to 164 constituting the electrode junction structures 159, the more the method of forming the electrode junction structure 159 according to the present embodiment is able to exert its effect. One reason for this is that it seems that the larger the volume of the Cu 216, the larger the volume change accompanying the thermal expansion, and the greater the degree of pumping. In other words, the technology according to the present embodiment is able to be suitably applied to the formation of a via and an electrode in a case where pumping can occur to the extent that a trouble is considered to occur in joining in a Cu structure including a combination of the via and the electrode. Note that a condition under which pumping can occur to the extent that a trouble is considered to occur in joining is able to be defined by, for example, the volume, the aspect ratio, or the like of the Cu structure including the combination of the via and the electrode. Specifically, the volume, the aspect ratio, or the like may be appropriately determined in consideration of, for example, the thermal expansion coefficient of Cu. For example, the vias 171 to 174 and the electrodes 161 to 164 in the semiconductor device 1 illustrated in FIG. 1 may have a length of about 7 μm and a diameter of about 3 μm. In this case, considering the thermal expansion coefficient of Cu and the like, it seems that the degree of pumping is relatively large in the vias 171 to 174 and the electrodes 161 to 164, and there is a possibility that a trouble can occur in joining unless any countermeasures are taken. In other words, it is possible to say that the vias 171 to 174 and the electrodes 161 to 164 having the above-mentioned sizes are vias and electrodes of sizes to which the technology according to the present embodiment is able to be suitably applied.

Here, for example, Japanese Unexamined Patent Application Publication No. 2013-115123 describes a wiring substrate used for mounting electronic components or the like, which includes an insulating plate including a ceramic sintered body and having a wiring conductor formed on its surface, and a via in which an electric conductor is embedded in a through hole penetrating the insulating plate in a thickness direction. Further, the electric conductor of the via thermally expands and breaks the insulating plate due to heat applied during mounting of the electronic component or during inspection. To prevent this, the document discloses a method of providing voids between a sidewall of a through hole and an electric conductor when embedding the electric conductor in the through hole in forming a via. Specifically, in this document, a paste containing a metal powder is embedded in the through hole, and heat treatment is performed to sinter the metal powder, thereby forming voids in the via. It seems that applying this method to the formation of the vias 171 to 174 and the electrodes 161 to 164 of the semiconductor device 1 described above makes it possible to suppress the occurrence of pumping.

However, as described above, the technology described in the document relates to a via provided in an insulating plate including a ceramic sintered body, and the document describes that the via has a diameter of, for example, 200 μm to 700 μm. Further, the method of forming voids in the via described in the document is not a typical semiconductor manufacturing process. On the other hand, as described above, in the semiconductor device 1 targeted in the present embodiment, the vias 171 to 174 and the electrodes 161 to 164 are formed in a semiconductor substrate such as a Si substrate or an insulating film including $SiO_2$ or the like, and the diameters of the vias 171 to 174 and the electrodes 161 to 164 may be about several micrometers at most. Since the target products are thus completely different, it is possible to say that it is almost impossible to apply the technology described in the document as it is to the semiconductor device 1.

In contrast, in the formation method according to the present embodiment, the vias 171 to 174 and the electrodes 161 to 164 related to the electrode junction structures 159*a* and 159*b* are formed using a semiconductor manufacturing process. Specifically, the through hole 212 is provided in materials generally used in semiconductor devices, such as Si and $SiO_2$. In addition, the diameter of the through hole 212 (i.e., the diameters of the vias 171 to 174 and the electrodes 161 to 164) is about several micrometers, for example, and a via diameter in a typical semiconductor device is targeted. Further, the space 218 is also formed using a semiconductor manufacturing process. It is thus possible to say that the formation method according to the present embodiment is a suitable formation method for forming the vias 171 to 174 and the electrodes 161 to 164 in the semiconductor device 1.

(4. Application Examples)
(Configuration Example for Stacked Solid-State Imaging Device)

The technology according to the present disclosure (present technology) is applicable to various products. For example, the technology according to the present disclosure may be applied to a stacked solid-state imaging device as described below.

FIG. 8 is a cross-sectional view of a configuration example of a stacked solid-state imaging device to which the technology according to the present disclosure is applicable.

FIG. 8 illustrates a configuration example of a stacked solid-state imaging device. As illustrated in FIG. 8, a solid-state imaging device 23020 is configured as a single semiconductor chip in which two dies, a sensor die 23021 and a logic die 23024, are stacked and electrically coupled to each other.

In the sensor die 23021 are formed PDs (photodiodes), FDs (floating diffusions), and Trs (MOS FETs), which constitute pixels serving as a pixel region, Trs serving as a control circuit, and the like. Further, a wiring layer 23101 including a plurality of layers, in this example, three layers of wiring lines 23110, is formed in the sensor die 23021. Note that (the Trs serving as) the control circuit may be formed not in the sensor die 23021, but in the logic die 23024.

In the logic die 23024 are formed Trs constituting a logic circuit. Further, a wiring layer 23161 including a plurality of layers, in this example, three layers of wiring lines 23170, is formed in the logic die 23024. In addition, a contact hole 23171 in which an insulating film 23172 is formed on the inner wall surface is formed in the logic die 23024, and a connection conductor 23173 coupled to the wiring lines 23170 and the like is embedded in the contact hole 23171.

The sensor die 23021 and the logic die 23024 are bonded to each other so that their wiring layers 23101 and 23161 face each other, thereby forming a stacked solid-state imaging device 23020 in which the sensor die 23021 and the logic die 23024 are stacked.

The solid-state imaging device 23020 is configured by overlapping the sensor die 23021 and the logic die 23024 so that the wiring lines 23110 and 23170 come into direct contact with each other, heating them while applying a desired weight, and directly joining the wiring lines 23110 and 23170. Thus, the sensor die 23021 and the logic die 23024 are electrically coupled to each other through the wiring layer 23101 and the wiring layer 23161.

The technology according to the present disclosure is applicable to the solid-state imaging device as described above.

(Examples of Application to Electronic Apparatus)

The technology according to the present disclosure (present technology) is applicable to various products. For example, the technology according to the present disclosure may be applied to electronic apparatuses as illustrated in FIGS. 9 to 11.

FIG. 9 illustrates an appearance of a smart phone, which is an example of an electronic apparatus to which the semiconductor device 1 according to the present embodiment is applicable. As illustrated in FIG. 9, a smartphone 301 includes an operation unit 303 that includes buttons and accepts an operation input by a user, a display unit 305 that displays various kinds of information, and an imaging unit (not illustrated) that is provided in a housing and electronically images an observation object. The imaging unit may include the semiconductor device 1.

FIGS. 10 and 11 illustrate the appearance of a digital camera, which is another example of an electronic apparatus to which the semiconductor device 1 according to the present embodiment is applicable. FIG. 10 illustrates an appearance of a digital camera 311 as viewed from the front side (object side), and FIG. 11 illustrates an appearance of the digital camera 311 as viewed from the rear side. As illustrated in FIGS. 10 and 11, the digital camera 311 includes a main body (camera body) 313, an interchangeable lens unit 315, a grip unit 317 that is gripped by a user at the time of imaging, a monitor 319 that displays various kinds of information, an EVF 321 that displays a through image observed by the user at the time of imaging, and an imaging unit (not illustrated) that is provided in a housing and electronically images an observation object. The imaging unit may include the semiconductor device 1.

Some examples of electronic apparatuses to which the semiconductor device 1 according to the present embodiment is applicable have been described above. Note that the electronic apparatus to which the semiconductor device 1 is applicable is not limited to those exemplified above, and the semiconductor device 1 is applicable as an imaging unit mounted on any electronic apparatus, such as a video camera, a glasses-type wearable device, an HMD (Head Mounted Display), a tablet PC, or a game console.

(Example of Application to Endoscopic Surgery System)

The technology according to the present disclosure (present technology) is applicable to various products. For example, the technology according to the present disclosure may be applied to an endoscopic surgery system.

FIG. 12 is a view depicting an example of a schematic configuration of an endoscopic surgery system to which the technology according to an embodiment of the present disclosure (present technology) can be applied.

In FIG. 12, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 13 is a block diagram depicting an example of a functional configuration of the camera head 11102 and the CCU 11201 depicted in FIG. 12.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure is applicable has been described above. The technology according to the present disclosure is applicable to, for example, the image pickup unit 11402 of the camera head 11102, out of the components described above. Applying the technology according to the present disclosure to the image pickup unit 11402 enables an endoscopic surgery system with higher reliability to be provided.

Note that although the endoscopic surgery system has been described as an example here, the technology according to the present disclosure may also be applied to, for example, a microscopic surgery system or the like.
(Example of Application to Mobile Body)

The technology according to the present disclosure (present technology) is applicable to various products. For example, the technology according to the present disclosure may be implemented as an apparatus mounted on any type of mobile body such as an automobile, an electric vehicle, a hybrid electric vehicle, a motorcycle, a bicycle, a personal mobility, an airplane, a drone, a vessel, or a robot.

FIG. 14 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 14, an audio speaker 12061, a display section 12062, and an instrument panel 12063 are illustrated as the output device. The display section 12062 may, for example, include at least one of an on-board display and a head-up display.

FIG. 15 is a diagram depicting an example of the installation position of the imaging section 12031.

In FIG. 15, the vehicle 12100 includes, as the imaging section 12031, imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by the imaging sections 12101 and 12105 is used mainly to detect a preceding vehicle, a pedestrian, an obstacle, a signal, a traffic sign, a lane, or the like.

Incidentally, FIG. 15 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure is applicable has been described above. The technology according to the present disclosure is applicable to the imaging section 12031 among the above-described components. Applying the technology according to the present disclosure to the imaging section 12031 enables a vehicle control system with higher reliability to be provided.

(5. Supplement)

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, in the above embodiment, the space 218 is provided over the entire region of the via 173 and the electrode 163 in the z-axis direction (i.e., the height of the space 218 in the z-axis direction is substantially equal to the height of the via 173 and the electrode 163 in the z-axis direction), but the present disclosure is not limited to such an example. In the technology according to the present disclosure, the space 218 may be present only in a partial region of the via 173 and the electrode 163 in the z-axis direction (e.g., only in a region corresponding to one of the via 173 and the electrode 163, or the like). Even in this case, the thermal expansion of the Cu 216 is able to be absorbed by the space 218 in the region provided with the space 218, which enables the effect of suppressing the occurrence of pumping to be obtained. For example, if a finding about a region in which thermal expansion of the Cu 216 can occur remarkably is obtained on the basis of the shapes of the via 173 and the electrode 163, the heat treatment condition, and the like, the space 218 may be provided only in a region in which thermal expansion of the Cu 216 can occur remarkably on the basis of the finding.

Further, for example, in the above embodiment, a case where the material constituting the vias 171 to 174 and the electrodes 161 to 164 is Cu has been described, but the present disclosure is not limited to such an example. In the technology according to the present disclosure, the material constituting the vias 171 to 174 and the electrodes 161 to 164 may be any of various well-known electrically-conductive materials other than Cu. Note that the larger the thermal expansion coefficient of the electrically-conductive material, the more remarkable the degree of pumping; therefore, it is considered to be possible to obtain a greater effect by the technology according to the present disclosure.

Further, for example, in the above embodiment, a case where the semiconductor device 1 is a solid-state imaging device has been described as an example, but the present disclosure is not limited to such an example. The technology according to the present disclosure is applicable to various semiconductor devices as long as it is a stacked semiconductor device.

Further, the effects described in this specification are merely illustrative or exemplified effects, and are not limitative. That is, with or in the place of the above effects, the technology according to the present disclosure may achieve other effects that are clear to those skilled in the art from the description of this specification.

Note that the technical scope of the present disclosure also includes the following configurations.

(1)

A semiconductor device including a plurality of substrates that is stacked, each of the substrates including a semiconductor substrate and a multi-layered wiring layer stacked on the semiconductor substrate, the semiconductor substrate having a circuit with a predetermined function formed thereon, in which bonding surfaces between at least two substrates among the plurality of substrates have an electrode junction structure in which electrodes formed on the respective bonding surfaces are joined in direct contact with each other, the electrode junction structure being a structure for electrical connection between the two substrates, and in at least one of the two substrates, at least one of the electrode constituting the electrode junction structure or a via for connection of the electrode to a wiring line in the multi-layered wiring layer has a structure in which a protective film for prevention of diffusion of an electrically-conductive material constituting the electrode and the via is embedded inside the electrically-conductive material.

(2)

The semiconductor device according to (1), in which the electrically-conductive material constituting the electrode and the via is copper, and the protective film is a barrier metal film that prevents diffusion of the copper.

(3)

The semiconductor device according to (2), in which the barrier metal film is a film containing TiN, TaN, or WN.

(4)

The semiconductor device according to any one of (1) to (3), in which the protective film embedded inside the electrically-conductive material has a shape extending along a direction in which the substrates are stacked.

(5)

The semiconductor device according to (4), in which in the electrode and the via, the protective film embedded inside the electrically-conductive material is present over an entire region in the direction in which the substrates are stacked.

(6)

The semiconductor device according to any one of (1) to (5), in which the protective film embedded inside the electrically-conductive material has a substantially linear shape extending in one direction in a plane orthogonal to the direction in which the substrates are stacked, as viewed from the direction in which the substrates are stacked.

(7)

The semiconductor device according to any one of (1) to (5), in which the protective film embedded inside the electrically-conductive material has a substantially dot-like shape, as viewed from the direction in which the substrates are stacked.

(8)

The semiconductor device according to any one of (1) to (5), in which the protective film embedded inside the electrically-conductive material has a substantially cross-like shape in which a substantially linear shape extending in a first direction in a plane orthogonal to the direction in which the substrates are stacked intersects a substantially linear shape extending in a second direction orthogonal to the first direction in the plane, as viewed from the direction in which the substrates are stacked.

(9)

The semiconductor device according to any one of (1) to (8), in which a first substrate, which is one of the plurality of substrates, is a pixel substrate including a pixel unit in which pixels are two-dimensionally arranged on the semiconductor substrate, and the semiconductor device includes a solid-state imaging device.

(10)

The semiconductor device according to (9), in which a second substrate among the plurality of substrates, the second substrate being present directly below the first substrate, includes a pixel signal-processing circuit that performs analog-to-digital conversion on a pixel signal acquired in each of the pixels, and bonding surfaces between the first substrate and the second substrate have the electrode junction structure for transmission of the pixel signal to the pixel signal-processing circuit for each of the pixels.

(11)

The semiconductor device according to any one of (1) to (10), in which the via has a structure in which the electrically-conductive material is embedded in a through hole penetrating the semiconductor substrate.

(12)

A method of manufacturing a semiconductor device, including steps of:

preparing a plurality of substrates, each of the substrates including a semiconductor substrate and a multi-layered wiring layer stacked on the semiconductor substrate, the semiconductor substrate having a circuit with a predetermined function formed thereon; and stacking the plurality of substrates, in which bonding surfaces between at least two substrates among the plurality of substrates have an electrode junction structure in which electrodes formed on the respective bonding surfaces are joined in direct contact with each other, the electrode junction structure being a structure for electrical connection between the two substrates, and a step of forming, in at least one of the two substrates, the electrode constituting the electrode junction structure and a via for connection of the electrode to a wiring line in the multi-layered wiring layer includes steps of forming a through hole that extends from one surface of the substrate to the wiring line, with a columnar portion having a columnar shape left in a partial region inside the through hole, forming a protective film for prevention of diffusion of an electrically-conductive material constituting the electrode and the via on at least a sidewall of the through hole and a sidewall of the columnar portion, embedding the electrically-conductive material in the through hole, and removing the columnar portion to form a space whose side surface is surrounded by the protective film in a region where the columnar portion was present.

(13)

The method of manufacturing the semiconductor device according to (12), in which the electrode junction structure is formed by bonding the two substrates together in a state in which the electrodes formed on the respective bonding surfaces are in direct contact with each other, and then performing heat treatment to join the electrodes in contact with each other.

(14)

The method of manufacturing the semiconductor device according to (12) or (13), in which in the electrode and the via, the space has a long shape extending along a direction in which the substrates are stacked.

(15)

The method of manufacturing the semiconductor device according to (14), in which in the electrode and the via, the space is present over an entire region in the direction in which the substrates are stacked.

(16)

The method of manufacturing the semiconductor device according to any one of (12) to (15), in which the space has a substantially rectangular shape extending in one direction in a plane orthogonal to the direction in which the substrates are stacked, as viewed from the direction in which the substrates are stacked.

(17)

The method of manufacturing the semiconductor device according to any one of (12) to (15), in which the space has a substantially square shape, as viewed from the direction in which the substrates are stacked.

(18)

The method of manufacturing the semiconductor device according to any one of (12) to (15), in which the space has a substantially cross-like shape in which a substantially rectangular shape extending in a first direction in a plane orthogonal to the direction in which the substrates are stacked intersects a substantially rectangular shape extending in a second direction orthogonal to the first direction in the plane, as viewed from the direction in which the substrates are stacked.

(19)

An electronic apparatus with a solid-state imaging device that electronically images an observation object, the solid-state imaging device including a plurality of substrates that is stacked, each of the substrates including a semiconductor substrate and a multi-layered wiring layer stacked on the semiconductor substrate, the semiconductor substrate having a circuit with a predetermined function formed thereon, in which bonding surfaces between at least two substrates among the plurality of substrates have an electrode junction structure in which electrodes formed on the respective bonding surfaces are joined in direct contact with each other, the electrode junction structure being a structure for electrical connection between the two substrates, and in at least one of the two substrates, at least one of the electrode constituting the electrode junction structure or a via for connection of the electrode to a wiring line in the multi-layered wiring layer has a structure in which a protective film for prevention of diffusion of an electrically-conductive material constituting the electrode and the via is embedded inside the electrically-conductive material.

REFERENCE NUMERALS LIST 1 semiconductor device
101, 121, 131 Si substrate
103, 109, 123, 129, 133, 202, 214 insulating film
105, 125, 135 multi-layered wiring layer
110A first substrate
110B second substrate
110C third substrate
111 CF layer
113 ML array
151 pad 153a, 153b pad opening
159, 159a, 159b electrode junction structure
161, 162, 163, 164, 206, 208 electrode
171, 172, 173, 174, 205, 207 via
181, 182 wiring line
203, 211, 215 barrier metal film
201, 212 through hole
213 columnar portion
204, 216 Cu
218, 218a, 218b space
301 smartphone (electronic apparatus)
311 digital camera (electronic apparatus)

The invention claimed is:

1. A method of manufacturing a semiconductor device, comprising:
preparing a plurality of substrates, wherein
each of the plurality of substrates includes a semiconductor substrate and a multi-layered wiring layer on the semiconductor substrate,
the semiconductor substrate includes a circuit having a specific function, and
the multi-layered wiring layer includes a wiring line;
stacking the plurality of substrates, wherein
a plurality of bonding surfaces between two substrates of the plurality of substrates has an electrode junction structure in which electrodes on respective bonding surfaces of the plurality of bonding surfaces are joined in direct contact with each other, and
the electrode junction structure is for electrical connection between the two substrates; and
forming, in at least one substrate of the two substrates, an electrode of the electrodes constituting the electrode junction structure and a via for connection of the electrode to the wiring line,
wherein the forming of the electrode and the via includes:
forming a through hole that extends from one surface of the at least one substrate to the wiring line, with a columnar portion having a columnar shape left in a partial region inside the through hole,
forming a protective film for prevention of diffusion of an electrically-conductive material constituting the electrode and the via, on at least a sidewall of the through hole and a sidewall of the columnar portion,
embedding the electrically-conductive material in the through hole, and
removing the columnar portion to form a space whose side surface is surrounded by the protective film.

2. The method of manufacturing the semiconductor device according to claim 1, further comprising
forming the electrode junction structure by bonding the two substrates together in a state in which the electrodes on the respective bonding surfaces are in direct contact with each other, and then performing heat treatment to join the electrodes in contact with each other.

3. The method of manufacturing the semiconductor device according to claim 1, wherein in the electrode and the via, the space has a long shape extending along a direction in which the plurality of substrates is stacked.

4. The method of manufacturing the semiconductor device according to claim 3, wherein
the space has a substantially cross-like shape in which, as viewed from the direction in which the plurality of substrates is stacked, a first substantially rectangular shape extending in a first direction intersects a second substantially rectangular shape extending in a second direction,
the first direction is in a plane orthogonal to the direction in which the plurality of substrates is stacked, and
the second direction is orthogonal to the first direction in the plane.

5. The method of manufacturing the semiconductor device according to claim 3, wherein the space has a substantially rectangular shape extending in one direction in a plane orthogonal to the direction in which the plurality of substrates is stacked, as viewed from the direction in which the plurality of substrates is stacked.

6. The method of manufacturing the semiconductor device according to claim 3, wherein in the electrode and the via, the space is present over an entire region of the electrode and the via in the direction in which the plurality of substrates is stacked.

7. The method of manufacturing the semiconductor device according to claim 3, wherein the space has a substantially square shape, as viewed from the direction in which the plurality of substrates is stacked.

8. A semiconductor device, comprising:
a plurality of substrates, wherein
each of the plurality of substrates includes:
a semiconductor substrate, and
a multi-layered wiring layer on the semiconductor substrate,
the semiconductor substrate includes a circuit having a specific function, and
the multi-layered wiring layer includes a wiring line; and
a plurality of bonding surfaces between two substrates of the plurality of substrates, wherein
the plurality of bonding surfaces has an electrode junction structure in which electrodes on respective bonding surfaces of the plurality of bonding surfaces are in direct contact with each other,
the electrode junction structure is configured to provide electrical connection between the two substrates,
in at least one of the two substrates, at least one of an electrode of the electrodes constituting the electrode junction structure or a via has a structure in which a protective film is inside an electrically-conductive material constituting the electrode and the via,
the via connects the electrode to the wiring line in the multi-layered wiring layer, and
the protective film is configured to prevent diffusion of the electrically-conductive material.

9. The semiconductor device according to claim 8, wherein the via has a structure in which the electrically-conductive material is in a through hole that penetrates the semiconductor substrate.

10. The semiconductor device according to claim 8, further comprising a solid-state imaging device, wherein
a first substrate of the plurality of substrates is a pixel substrate,
the pixel substrate includes a pixel unit in which a plurality of pixels is two-dimensionally arranged on the semiconductor substrate, and
each pixel of the plurality of pixels is configured to acquire a pixel signal.

11. The semiconductor device according to claim 10, wherein
a second substrate of the plurality of substrates is directly below the first substrate, the second substrate includes a pixel signal-processing circuit configured to perform analog-to-digital conversion on the pixel signal, the plurality of bonding surfaces is between the first substrate and the second substrate, and the electrode junction structure is further configured to transmit the pixel signal to the pixel signal-processing circuit for each of the plurality of pixels.

12. The semiconductor device according to claim 8, wherein the electrically-conductive material constituting the electrode and the via is copper, and the protective film is a barrier metal film configured to prevent diffusion of the copper.

13. The semiconductor device according to claim 12, wherein the barrier metal film comprises one of TiN, TaN, or WN.

14. The semiconductor device according to claim 8, wherein a first substrate of the plurality of substrates is on a second substrate of the plurality of substrates in a first direction, and the protective film inside the electrically-conductive material has a shape extending along the first direction.

15. The semiconductor device according to claim 14, wherein the protective film inside the electrically-conductive material has a substantially cross-like shape in which, as viewed from the first direction, a first substantially linear shape extending in a second direction intersects a second substantially linear shape extending in a third direction, the second direction is in a plane orthogonal to the first direction, and the third direction is orthogonal to the second direction in the plane.

16. The semiconductor device according to claim 14, wherein the protective film inside the electrically-conductive material has a substantially linear shape extending in one direction in a plane orthogonal to the first direction, as viewed from the first direction.

17. The semiconductor device according to claim 14, wherein in the electrode and the via, the protective film inside the electrically-conductive material is present over an entire region of the electrode and the via in the first direction.

18. The semiconductor device according to claim 14, wherein the protective film inside the electrically-conductive material has a substantially dot-like shape, as viewed from the first direction.

19. An electronic apparatus, comprising:

a solid-state imaging device configured to electronically image an observation object, wherein the solid-state imaging device comprises:

a plurality of substrates, wherein each of the plurality of substrates includes:

a semiconductor substrate, and a multi-layered wiring layer on the semiconductor substrate, the semiconductor substrate includes a circuit having a specific function, and the multi-layered wiring layer includes a wiring line; and a plurality of bonding surfaces between two substrates of the plurality of substrates, wherein the plurality of bonding surfaces has an electrode junction structure in which electrodes on respective bonding surfaces of the plurality of bonding surfaces are in direct contact with each other, the electrode junction structure is configured to provide electrical connection between the two substrates, in at least one of the two substrates, at least one of an electrode of the electrodes constituting the electrode junction structure or a via has a structure in which a protective film is inside an electrically-conductive material constituting the electrode and the via, the via connects the electrode to the wiring line in the multi-layered wiring layer, and the protective film is configured to prevent diffusion of the electrically-conductive material.

* * * * *